United States Patent
Ooishi et al.

(10) Patent No.: US 6,381,167 B2
(45) Date of Patent: Apr. 30, 2002

(54) SEMICONDUCTOR MEMORY DEVICE INCLUDING PLURALITY OF GLOBAL DATA LINES IN PARALLEL ARRANGEMENT WITH LOW PARASITIC CAPACITANCE, AND FABRICATION METHOD THEREOF

(75) Inventors: Tsukasa Ooishi; Hiroaki Tanizaki, both of Hyogo (JP)

(73) Assignees: Mitsubishi Denki Kabushiki Kaisha; Mitsubishi Electric Engineering Company Limited, both of Tokyo (JP)

(*) Notice: Subject to any disclaimer, the term of this patent is extended or adjusted under 35 U.S.C. 154(b) by 0 days.

(21) Appl. No.: 09/781,238

(22) Filed: Feb. 13, 2001

(30) Foreign Application Priority Data

Jun. 5, 2000 (JP) .......................... 12-167643

(51) Int. Cl.$^7$ ................................ G11C 5/06

(52) U.S. Cl. ........................ 365/63; 365/230.03

(58) Field of Search .................... 365/210, 230.03, 365/231, 189.09, 63

(56) References Cited

U.S. PATENT DOCUMENTS 5,499,215 A * 3/1996 Hatta ................. 365/230.03
5,724,291 A * 3/1998 Matano ................. 365/207

FOREIGN PATENT DOCUMENTS

| JP | 5-12883 | 1/1993 |
| JP | 8-77793 | 3/1996 |
| JP | 10-27467 | 1/1998 |

* cited by examiner

Primary Examiner—David Nelms
Assistant Examiner—Thong Le
(74) Attorney, Agent, or Firm—McDermott, Will & Emery

(57) ABSTRACT

A read data line pair is arranged for every four memory cell columns. Column selection in data reading is carried out by four sub read source lines. A write data line pair is arranged for every eight memory cell columns. Column selection in a data write operation is carried out by eight sub write activation lines. By differentiating the number between the read data line pairs and the write data line pairs and the corresponding memory cell columns, the wiring pitch of the data lines can be alleviated to suppress parasitic capacitance while avoiding significant increase of the signal lines to execute column selection.

11 Claims, 16 Drawing Sheets

SEMICONDUCTOR MEMORY DEVICE INCLUDING PLURALITY OF GLOBAL DATA LINES IN PARALLEL ARRANGEMENT WITH LOW PARASITIC CAPACITANCE, AND FABRICATION METHOD THEREOF

BACKGROUND OF THE INVENTION

1. Field of the Invention

The present invention relates to semiconductor memory devices. More particularly, the present invention relates to a semiconductor memory device having a memory cell array structure that can deal with many input/output data simultaneously, and a method of fabricating such a semiconductor memory device.

2. Description of the Background Art

In accordance with the recent development of information communication technology, the need arises for a semiconductor memory device that can handle many data at high speed and in parallel in addition to the large memory capacity. A typical example is the application of carrying out data processing with respect to image data.

To accommodate the need, a semiconductor memory device is employed having a structure including a plurality of banks capable of read and write operations independently to process a large amount of data simultaneously by a plurality of global data lines arranged in parallel.

In a semiconductor memory device having a memory cell array of high complexity, the redundancy repair technology of repairing the defective portion of the regular memory cell generated during fabrication by a spare memory cell provided in advance on the same chip becomes an important element in ensuring the product yield.

In accordance with the increase of the memory capacity, Japanese Patent Laying-Open No. 8-77793, for example, discloses the art to carry out layout designing efficiently by repairing a redundancy circuit among a plurality of memory cell arrays (corresponding to banks) capable of reading and writing data independently, as the technique to carry out redundancy reparation efficiently.

In such a semiconductor memory device having many global data lines arranged, increase of the parasitic capacitance in the global data lines arranged in multiple arrangement becomes a problem. This is because the arrangement pitch of the global data lines is reduced by providing so many global data lines in parallel. In a semiconductor memory device of such a structure, the global data line arrangement becomes a critical factor in increasing the speed of data input/output and reducing power consumption.

Since the circuit used for redundancy repair generally requires a large layout area, the appropriate provision of the circuit for redundancy repair is significant in reducing the layout area in such a memory array that has many global data lines arranged in parallel.

SUMMARY OF THE INVENTION

In view of the foregoing, an object of the present invention is to provide a structure that can have parasitic capacitance of global data lines reduced in a semiconductor memory device including numerous global data lines, capable of a large amount of data input/output in parallel, and a fabrication method thereof.

According to an aspect of the present invention, a semiconductor memory device includes a memory cell array, a plurality of read data lines, a plurality of write data lines, a plurality of read column select lines, a plurality of write column select lines, a read select gate, and a write select gate.

The memory cell array includes a plurality of memory cell blocks arranged in a matrix. Each memory cell block includes a plurality of memory cells arranged in a matrix. The plurality of read data lines are shared between a plurality of memory cell blocks adjacent in the column direction. Each read data line is arranged for every L (L is a natural number) memory cell columns to transmit data read out from the memory cell array. The plurality of write data lines are shared between a plurality of memory cell blocks adjacent in the column direction. Each write data line is arranged for every M (M is a natural number) memory cell columns to transmit data to be written into the memory cell array. The plurality of read column select lines transmit a read column select signal to select one memory cell column from the L memory cell columns in each memory cell block. The plurality of write column select lines transmit a write column select line to select one memory cell column from M memory cell columns in each memory cell block. The read select gate is provided for every L memory cell columns in each memory cell block to transmit the data read out from the selected memory cell column in response to the read column select signal to a corresponding one of the plurality of read data lines. The write select gate is provided for every M memory cell columns in each memory cell block to transmit the write data from one of the plurality of write data lines to the selected memory cell column in response to a write column select signal.

According to another aspect of the present invention, a semiconductor memory device formed on a semiconductor substrate includes a memory cell array region, a transistor layer, a capacitor layer, a first interconnection layer, a second interconnection layer, and a plurality of global data lines.

The memory cell array region includes a plurality of memory cells arranged in a matrix. Each memory cell includes an access transistor and a data storage capacitor. The transistor layer is formed on the semiconductor substrate. A transistor including an access transistor is arranged at the transistor layer. The capacitor layer is formed at the top surface of the transistor layer up to a first height in the memory cell array region. A data storage capacitor is arranged at the capacitor layer. The first interconnection layer is formed at the top surface of the transistor layer at a height between a second height that is lower than the first height and a third height higher than the first height, outside the memory cell array region. The second interconnection layer is arranged in common at the memory cell array region and outside the memory cell array region at the top surface of the transistor layer at a height between a fourth height higher than the third height and a fifth height higher than the fourth height. The plurality of global data lines are arranged at the second interconnection layer to transmit data read and written with respect to the plurality of memory cell arrays.

According to a further aspect of the present invention, a fabrication method of a semiconductor memory device includes the steps of forming a transistor layer on a semiconductor substrate, forming a capacitor layer on a memory cell array region, forming an interlayer insulation film on the capacitor layer, providing a region where a reference line is to be arranged to couple a cell plate layer formed at the top surface side of the capacitor layer to the reference potential by grinding the cell plate layer partially, forming a metal film after a portion of the cell plate layer is ground, working on the metal film according to a predetermined wiring pattern to form a plurality of lines including the reference line.

The main advantage of the present invention is that parasitic capacitance is suppressed by alleviating the wiring pitch in the horizontal direction for either the plurality of read data lines or the plurality of write data lines without significantly increasing the number of the plurality of read column select lines and the plurality of write column select lines. As a result, the speed can be increased and power consumption reduced in either the data read operation or the data write operation.

The parasitic capacitance of the wiring formed at the second interconnection layer where a plurality of global data lines are arranged can be suppressed than the case where the interconnection layer formed at the memory cell region and outside the memory cell region is designed in common. Therefore, the speed can be increased and power consumption reduced in the data read and write operations carried out by the plurality of global data lines.

The reference line to fix the potential of the cell plate can be arranged without having to provide a contact hole to the cell plate. Since the aspect ratio of the contact hole formed on the semiconductor substrate does not have to be changed greatly, fabrication of the contact hole in the entire semiconductor memory device can be facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detailed hereinafter with reference to the drawings.

First Embodiment

Figure 1:
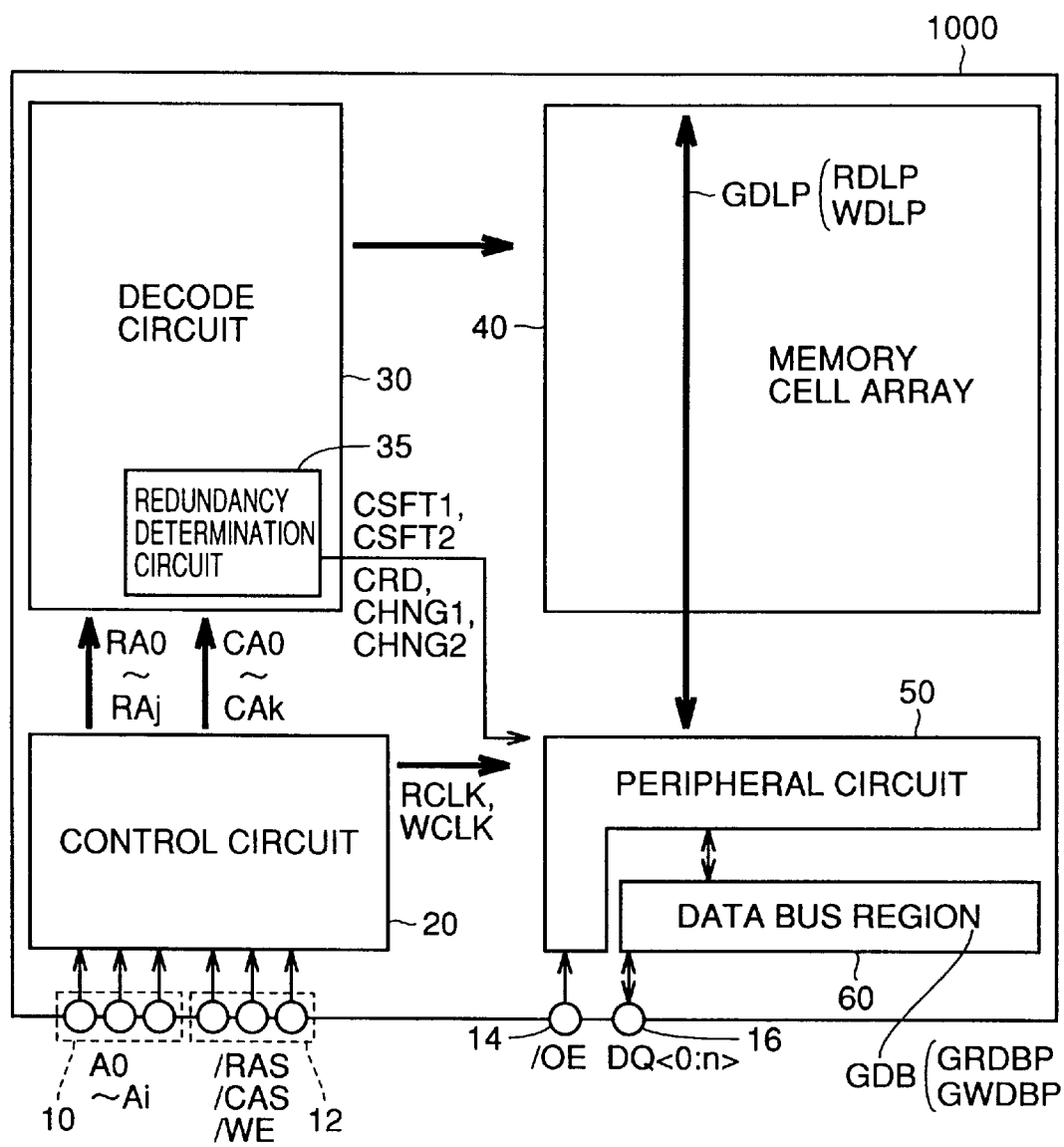
FIG. 1 is a schematic block diagram of a structure of semiconductor memory device 1000 according to a first embodiment of the present invention.

Referring to FIG. 1, a semiconductor memory device 1000 according to a first embodiment of the present invention includes an address terminal 10 receiving an address signal of (i+1) bits formed of address bits A0–Ai (i: natural number), a control signal input terminal 12 receiving a command control signal such as a row address strobe signal /RAS, a column address strobe signal /CAS, a write enable signal /WE, and the like, an output enable terminal 14 receiving an output enable signal /OE, and a data terminal 16 for input/output data of (n+1) bits of data bits DQ<0>–DQ<n> (n: natural number). In the following, such a signal of a plurality of bits is also represented as DQ<0:n>.

Semiconductor memory device 1000 further includes a control circuit 20 receiving an address signal and a command control signal to control the internal operation of semiconductor memory device 1000, a memory cell array 40 with a plurality of memory cells arranged in a matrix, a decode circuit 30 executing memory cell selection in memory cell array 40 in response to a row address and a column address specified by control circuit 20, a peripheral circuit 50 to process the data input to/output from memory cell array 40, and a data bus region 60 in which a data bus is arranged between peripheral circuit 50 and data terminal 16 to transmit data input to/output from memory cell array 40.

Control circuit 20 generates and provides to data circuit 30 row address signals RA0–RAj (j: natural number) and column address signals CA0–CAk (k: natural number) according to address bits A0–Ai and command control signals /RAS, /CAS and /WE. Control circuit 20 also generates a read clock RCLK and a write lock WCLK which are clock signals to input/output data with respect to peripheral circuit 50.

Decode circuit 30 generates control signals to execute memory cell selection in memory cell array 40 according to row address signals RA0–RAj and column address signals CA0–CAk. The control signals generated by decode circuit 30 include a signal to render a word line active, a signal to carry out column selection, and the like, as will be described in detail afterwards.

Decode circuit 30 includes a redundancy determination circuit 35. Redundancy determination circuit 35 includes a program circuit (not shown) formed of, for example, a fuse element, or the like. The defective address corresponding to the defective portion in memory cell array 40 determined in the operation test and information required to repair the defective portion can be stored in a nonvolatile manner.

When the relevant defective address is selected by the row address signal and the column address signal, redundancy determination circuit 35 controls peripheral circuit 50 by a redundancy control signal to carry out redundancy-repair with respect to the defective portion by a spare memory cell provided in memory cell array 40.

A global data line pair GDLP is provided on memory cell array 40 whose structure will be described in detail afterwards. In the present invention, the global data line pair is provided independently for read data and write data. More specifically, global data line pair GDLP is a generic representation of a read data line pair RDLP and a write data line pair WDLP.

Data transmission between a memory cell selected by decode circuit 30 and peripheral circuit 50 is carried out via global data line pair GDLP. Peripheral circuit 50 receives/sends the read/write data with respect to memory cell array 40 transmitted through global data line pair GDLP to/from data bus region 60. When execution of redundancy repair is designated by redundancy determination circuit 35, peripheral circuit 50 carries out a redundancy repair operation through connecting selection of a data line according to a group of control signals generated by redundancy determination circuit 35.

A global read data bus pair GRDBP to transmit read data and a global write data bus pair GWDBP to transmit write data are arranged in data bus region 60. Global read data bus pair GRDBP and global write data bus pair GWDBP are also generically called "data bus group" hereinafter.

The data transmitted by the data bus group is transferred with respect to an external source via data terminal 16. In the case where semiconductor memory device 1000 is mounted on a memory/logic embedded chip, a structure can be implemented in which data is directly transferred with respect to the logic unit by the data bus group arranged at data bus region 60.

Figure 2:
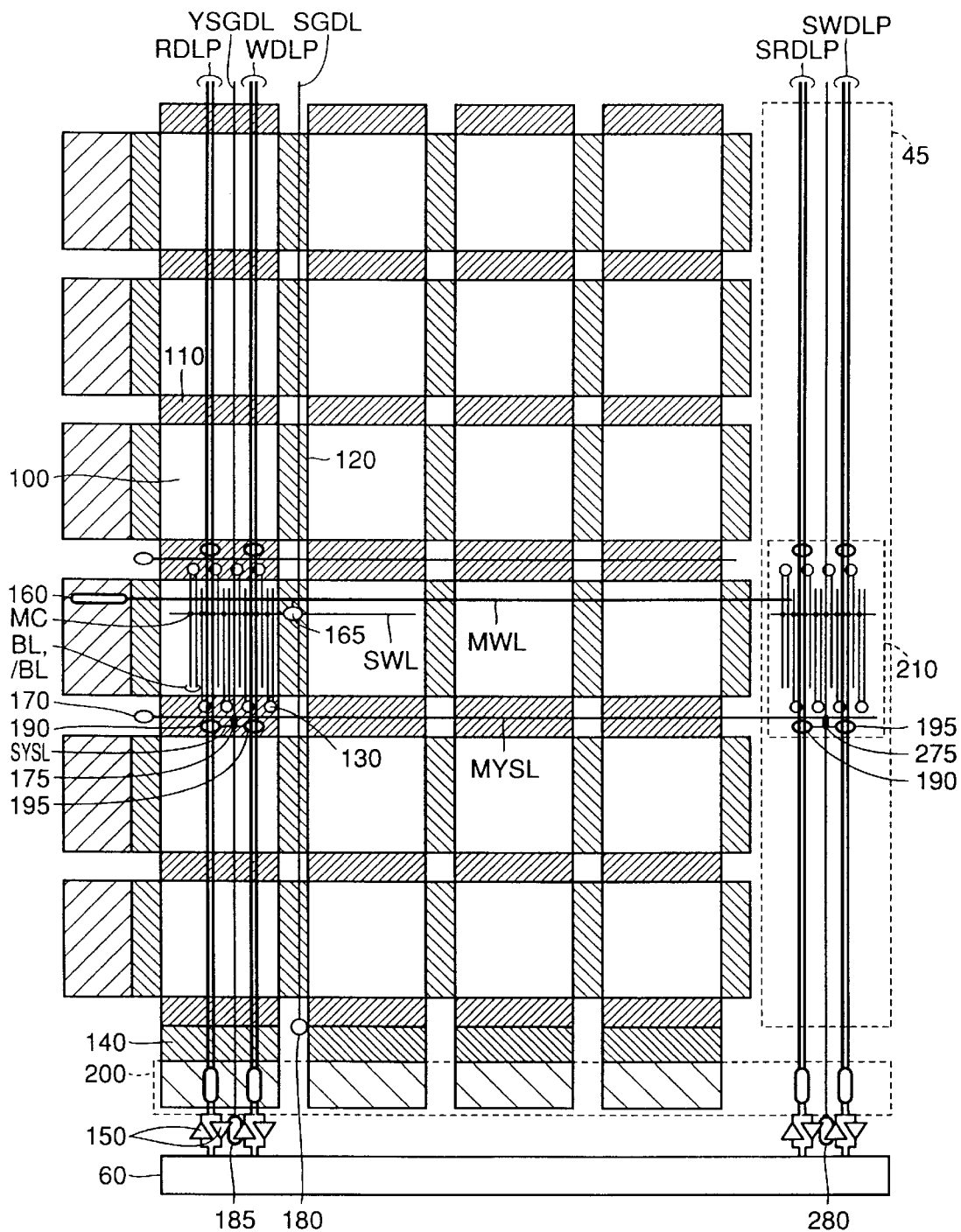
FIG. 2 is a diagram to describe the structure of a memory cell array 40 and peripheral circuitry thereof.

Referring to FIG. 2, memory cell array 40 is divided into memory cell blocks 100 surrounded by a sense amplifier band 110 and a sub word driver band 120. Memory cell blocks 100 are arranged in a matrix. Memory cell array 40 can be rendered active per unit of a memory cell block.

Memory cells MC are arranged in a matrix in each memory cell block 100. A sub word line SWL is arranged for each memory cell row. A pair of bit lines BL, /BL is arranged for each memory cell column. The data transmitted through bit line pair BL, /BL is amplified by a sense amplifier circuit 130 arranged at sense amplifier band 110.

Sense amplifier circuit 130 is arranged in an alternate manner between the unit of a memory cell block. One set of a read data line pair RDLP is provided corresponding to L (L: natural number) sense amplifier circuits 130, i.e., for every L memory cell columns. One set of a write data line pair WDLP is provided corresponding to M (M: natural number) sense amplifier circuits 130, i.e. for every M memory cell columns. The first embodiment of the present invention is characterized in that the number of memory cell columns which is the arrangement unit of the read data line pair and write data line pair differ, i.e. the value of L differs from the value of M.

A main word line MWL is provided in common to memory cell blocks adjacent in the row direction, spanning each memory cell block. A main word driver 160 is provided corresponding to main word line MWL to selectively render a corresponding main word line MWL active according to designation from decode circuit 30 according to a row address signal. A sub word line SWL is arranged for each memory cell row in each memory cell block. A sub word driver 165 arranged at sub word driver band 120 renders a corresponding sub word line SWL active according to designation of main word line MWL and a segment decode line SGDL.

A spare memory cell array 45 to repair the column including the defective memory cell in the memory cell block is arranged adjacent to the region of the regular memory cells formed in memory cell block 100. Spare memory cell array 45 is divided into a plurality of spare blocks 210 corresponding to a row of memory cell block 100. Memory cells MC are arranged in a matrix in spare block 210. Also, a bit line pair BL, /BL is arranged for each memory cell column.

A spare read data line pair SRDLP and a spare write data line pair SWDLP are provided in common between spare blocks 210 in spare memory cell array 45. In spare memory cell array 45, L memory cell columns correspond to a set of spare read data line pair SRDLP, and a set of spare write data line pair SWDLP is provided corresponding to every M memory cell columns.

Adjacent to memory cell array 40 are provided a read/write amplifier 140 to amplify data transmitted to a read data line pair RDLP, a write data line pair WDLP, a spare read data line pair SRDLP, and a spare write data line pair SWDLP (these data line pairs provided in common with respect to plurality of memory cell blocks 100 or spare block 120 on the memory cell array are generically referred to as a data line group), a data line connection select circuit 200 to set the connection status between the data line group and the data bus group, and an interface 150.

Data line connection select circuit 200 sets the connection between the data line group and the data bus group to control the signal transmission path according to the redundancy repair control by redundancy determination circuit 35. According to the connection status set by data line connection select circuit 200, transfer of read/write data is executed via read/write amplifier 140 and interface 150 between the data line group and the data bus group. Data line connection select circuit 200, read/write amplifier 140 and interface 150 are included in peripheral circuit 50 of FIG. 1.

More specifically, memory cell array 40 includes memory cell blocks 100 arranged in six rows and four columns. FIG. 2 shows only an example of the arrangement of memory cell blocks in six rows and four columns. An arbitrary number of memory cell blocks can be arranged in a matrix.

A segment decode line SGDL and a YS segment decode line YSGDL are arranged along the direction in which the data line group is arranged. Segment decode line SGDL and YS segment decode line YSGDL are rendered active by a segment decoder 180 and a YS segment decoder 185, respectively. Segment decode line SGDL transmits a signal to control the activation range of sub word line SWL. Segment decode line SGDL is provided to pass through the sub word driver band, and includes a bank select line BSL, a select line SL, and a column set line RSL. YS segment decode line YSGDL transmits a signal to selectively render active a partial range of the region corresponding to the same main YS line.

First, the row related select operation will be described. According to a row address signal, main word line MWL is selectively rendered active by main word driver 160. Sub word driver 165 is rendered active by main word line MWL and segment decode line SGDL to render a corresponding sub word line SWL active. Accordingly, the access transistor connected to the selected memory cell is rendered-conductive.

Here, it is assumed that four sub word lines SWL are provided corresponding to one main word line MWL. Select line SL is a generic representation of four select lines SL0–SL3. Similarly, a reset line RSL is a generic representation of four reset lines RSL0–RSL3.

Accordingly, data is output to bit line pair BL, /BL corresponding to the selected memory cell column. In spare block 210, a row of memory cells is selected according to activation of main word line MWL.

Next, the column related select operation will be described. A main YS line MYSL is rendered active by a main YS driver 170. Here, main YS line MYSL includes a read source line and a write activation line. The read source line transmits a signal to execute column selection in data reading. The write activation line transmits a signal to execute column selection in data readout.

Main YS line MYSL, i.e., the read source line and the write activation line, span each memory cell block, and are provided in common to the memory cell blocks adjacent in the row direction. The read source line and the write activation line are provided for every memory cell block group adjacent in the row direction corresponding to L memory cell columns and M memory cell columns corresponding to one read data line pair RDLP and write data line pair WDLP.

In the following, L read source lines RGL0–RGL(L-1) are generically represented as read source line RGL and M write activation lines WRL0–WRL(M-1) are generically represented as write activation line WRL, as necessary.

A sub YS line SYSL is provided as a select line lower in hierarchy with respect to main YS line MYSL. Sub YS line SYSL is rendered active by sub YS driver 175, and includes L sub read source lines and M sub write activation lines. Sub YS line SYSL is provided to selectively render active a partial range in the region corresponding to the same main YS line MYSL.

Sub read source lines are provided, L in number, corresponding to read source line RGL, for each sub YS driver 175. Similarly, M sub write activation lines are provided corresponding to write activation line WRL for each sub YS driver 175. In the following, L sub read source lines SRGL0–SRGL(L-1) are generically represented as sub read source line SRGL, and M sub write activation lines SWRL0–SWRL(M-1) are generically represented as sub write activation line SWRL, as necessary.

Eventually, a corresponding read select gate 190 connects one of L sense amplifier circuits to read data line pair RDLP in response to activation of sub YS line SYSL. Similarly, write select gate 195 connects one of M sense amplifier circuits to write data line pair WDLP.

An address match comparison determination to determine whether redundancy repair is required or not for a column address signal is carried out at a timing similar to that of column selection. It is to be noted that column selection in the spare memory cell array is carried out by a spare YS driver 275 according to a spare YS decoder 280 that is controlled independent of the match comparison determination of the defective address in redundancy determination circuit 35 and main YS line MYSL provided in common for regular memory cell arrays. Spare YS driver 275 renders spare sub YS line active. More specifically, in response to activation of spare sub YS line, respective ones out of the L sense amplifier circuits and M sense amplifier circuits are connected to spare read data line pair SRDLP and spare write data line pair SWDLP, respectively, by read select gate 190 and write select gate 195.

The redundancy control signal according to the result of the redundancy repair determination is transmitted to data line connection select circuit 200 to be reflected in the connection selection between the data line group and data bus region 60. Thus, the access in a read operation mode can be speeded since activation of spare sub YS line is carried out irrespective of the redundancy determination result between the programmed defective address and the input address.

A detailed structure of sub word driver band 120 will be described with reference to FIG. 3.

Figure 3:
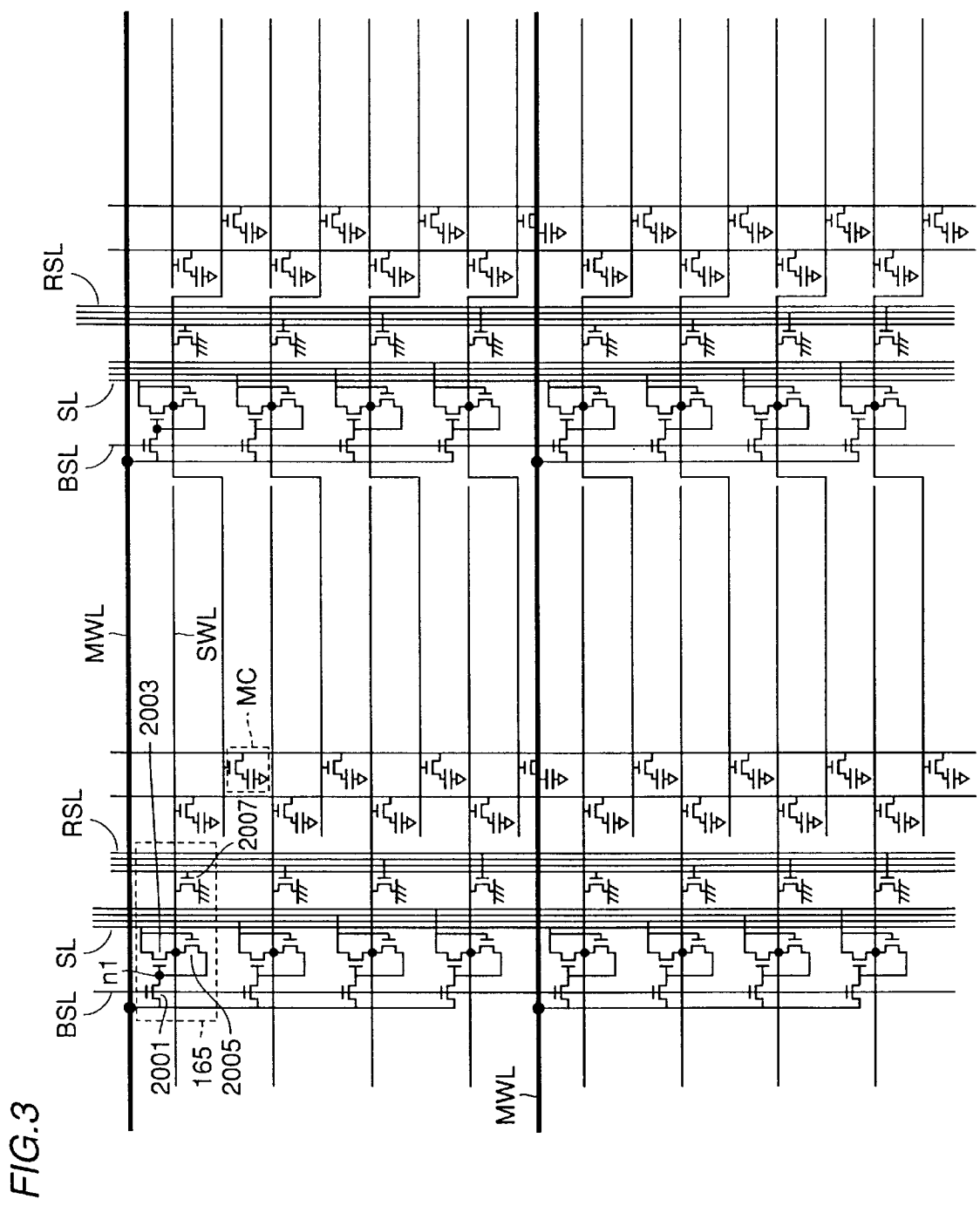
FIG. 3 is a circuit diagram to describe a detailed structure of a sub word driver band 120.

Referring to FIG. 3, sub word driver 165 includes a select transistor 2001 having a gate controlled by a bank select line BSL, provided between a main word line MWL and an internal node n1, a transistor 2003 having a gate coupled to node n1, and connected between one select line SL0 and sub word line SWL, a transistor 2005 having a gate potential controlled by select line SL0 identical to that of transistor 2003, and connected between sub word line SWL and node n1, and a transistor 2007 having a gate potential controlled by reset line RSL0, and provided between the sub word line and the ground potential.

Other sub word drivers have a similar structure between main word line MWL and sub word line SWL. By such a configuration, a corresponding word line SWL is rendered active (high potential) by rendering main word line MWL active, and then bank select line BSL and a corresponding select line SL active. By selectively rendering reset line RSL active, a corresponding sub word line SWL is discharged to the ground potential.

In the example of FIG. 3, one word line MWL controls four word lines SWL in each bank. Selection of any sub word line SWL is specified by activation of a corresponding one select line SL. Bank select line BSL is at the level of boosted potential Vpp at the time of activation, and is driven to the level of ground potential Vss after sub word line SWL is rendered active. In this case, the active status of bank select line BSL is maintained by a latch circuit formed of transistors 2003 and 2005. Control is provided so that the potential level between select line SL and reset line RSL are complementary to each other.

In a standby state, bank select line BSL is at the level of ground potential Vss, select line SL at the level of ground potential Vss, and reset line RSL at the level of power supply potential Vcc. In an activation operation, first the corresponding reset line is driven to the level of ground potential Vss, and bank select line BSL corresponding to sub word line SWL to be rendered active is activated to attain the level of boosted potential Vpp.

Then, main word line MWL is rendered active to attain the level of power supply potential Vcc. Substantially simultaneous to activation of main word line MWL, one select line SL attains the level of power supply potential Vcc, and sub word line SWL attains the level of (Vcc–Vth) (Vth is the sum of the threshold voltages of transistors 2001 and 2005). Then, bank select line BSL is driven to the level of ground potential Vss. Charge is stored in the latch circuit formed of transistors 2003 and 2005 in the sub word driver.

By increasing the potential level of the selected one select line SL up to the level of boosted potential Vpp under the status where the charge is confined by transistors 2003 and 2005, sub word line SWL is driven to the level of boosted potential Vpp.

In a reset operation, the bank select line is increased to the level of power supply potential Vcc, and select line SL is driven to the level of ground potential Vss. By setting reset line RSL at the level of power supply potential Vcc, the charge in sub word line SWL is discharged. By such a structure, the number of elements forming sub word driver 165 can be reduced to just the four elements of N channel MOS transistors.

Activation of main word line MWL is effected by a one shot pulse signal. More specifically, once the active status of the main word line is maintained by transistors 2003 and 2005 in sub word driver 165 corresponding to selected sub word line SWL, the potential level of main word line MWL is reset.

In the case where a plurality of memory cell blocks are aligned in the direction of the main word line as shown in FIG. 2, the potential level of main word line MWL will not affect sub word driver 165 as long as bank select line BSL is not rendered active in the above-described structure. Therefore, the two memory cell blocks adjacent in the row direction can be operated as independent banks.

Arrangement of the data line group in memory cell block 100 will be described with reference to FIG. 4.

Figure 4:
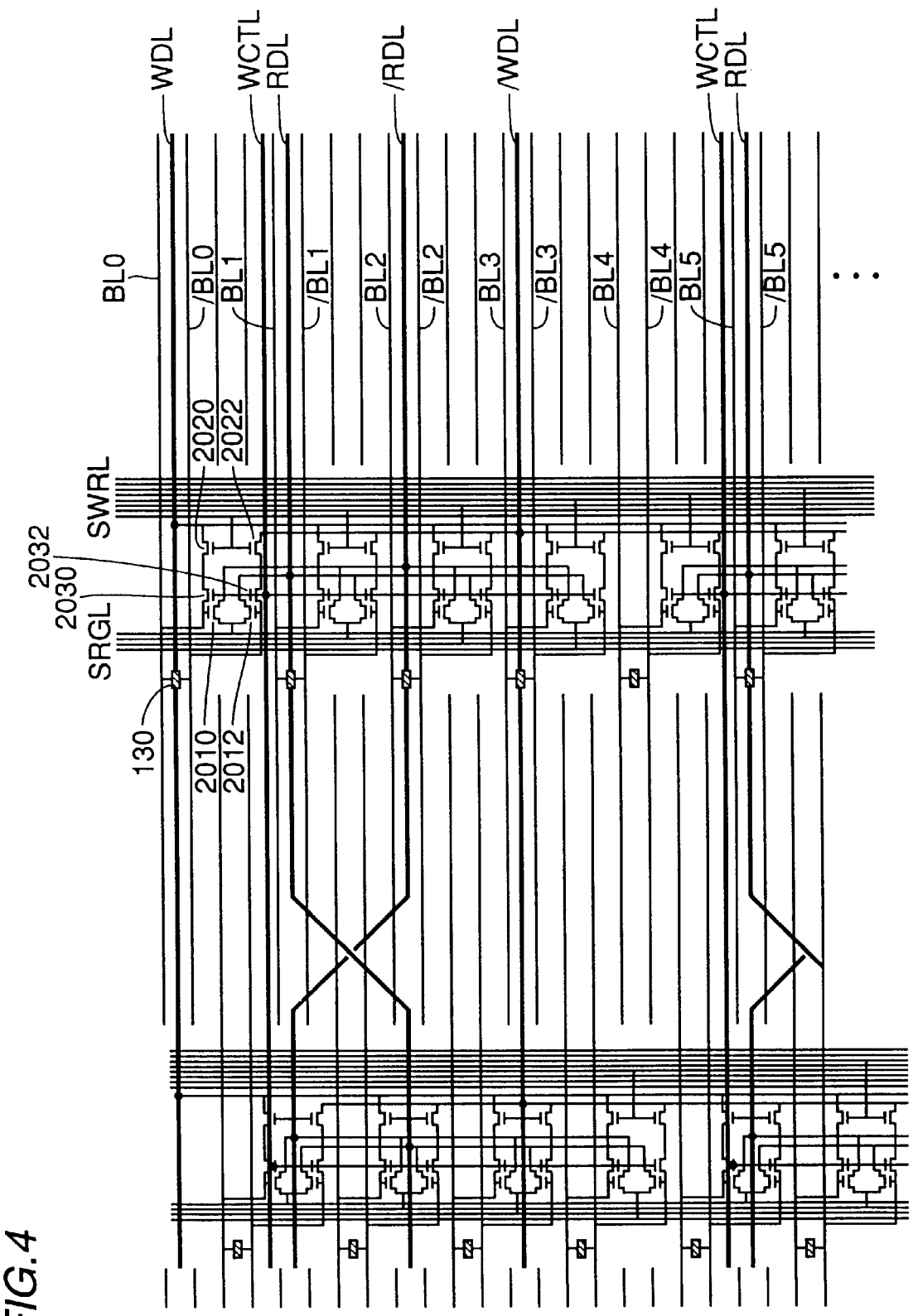
FIG. 4 is a circuit diagram to describe arrangement of a data line group in a memory cell block 100.

In FIG. 4, four sense amplifier circuits and one read data line pair RDLP are provided in correspondence. Also, eight sense amplifier circuits and one write data line pair WDLP are provided in correspondence. More specifically, L=4 and M=8 as to the values of L and M. Accordingly, four sub read source lines SRGL0–SWGL3 generically represented as sub read source line SRGL, and eight sub write activation lines SWRL0–SWRL7 generically represented as sub write activation line SWRL are arranged.

Read data line pair RDLP includes data lines RDL and /RDL transmitting data complementary to each other. Similarly, write data line pair WDLP includes data lines WDL and /WDL. Although description of the detailed structure of sense amplifier circuit 130 will not be repeated, it is to be noted that a sense amplifier formed of cross-coupled P channel MOS transistor and N channel MOS transistor in sense amplifier circuit 130 and an equalize transistor that equalizes bit line pair BL and /BL are provided. As to the relationship between the bit line pair and the sense amplifier, a sense amplifier is provided at the center region of the bit line pair. Accordingly, the time required for reading out data from a memory cell to a sense amplifier node can be reduced and the equalize operation can be speeded. This is because the resistance from the sense amplifier node to the bit line end is reduced by virtue of the presence of the sense amplifier at the center area of the bit line pair.

For example, the sense amplifier node of sense amplifier circuit 130 corresponding to bit line pair BL0, /BL0 and each data line pair are connected via transistor gates 2010 and 2012 forming read select gate 190 shown in FIG. 2, and via transistor gates 2020 and 2022 forming write select gate 195 shown in FIG. 2.

First, selection in a read operation will be described. The sense amplifier node in sense amplifier circuit 130 is connected to a read data line pair RDL, /RDL via read gate transistors 2010 and 2012. Transistors 2010 and 2012 have their sources selectively connected to ground potential Vss by read sub source line SRGL, their gates connected to the sense amplifier node in a corresponding sense amplifier circuit 130, and their drains connected to corresponding read data line pair RDL, /RDL. A similar structure is provided between the sense amplifier circuit and the read data line pair corresponding to bit line pairs BL1, /BL1–BL3, /BL3. Four sense amplifier circuits 130 share one read data line pair.

Next, the write operation will be described. Write data line pair WDL, /WDL is selectively connected by transistors 2020 and 2022 connected between one bit line BL of a corresponding bit line pair and one write data line WDL of the corresponding write data line pair, and between the other bit line /BL of the corresponding bit line pair and the other write data line /WDL of the corresponding write data line pair. A similar structure is provided between the sense amplifier circuit corresponding to bit line pairs BL1, /BL1–BL7, /BL7 and the write data line pair. The sense amplifier node in sense amplifier circuit 130 corresponding to bit line pairs BL0, /BL0–BL7, /BL7 is selectively connected to a write data line pair WDL, /WDL by transistors 2020 and 2022 having their gate potentials controlled by corresponding sub write activation lines SWRL0–SWRL7.

The write operation is carried out through transistor gates 2030 and 2032 having their gate potentials controlled by write control line WCTL. These transistor gates function to carry out a data mask operation. In a normal operation, transistors 2030 and 2032 are ON by precharging write control line WCTL at the level of power supply potential Vcc, whereby data is written into sense amplifier circuit 130 selected by sub write activation line SWRL. In the case where data writing is to be canceled partially, i.e. in the case where a data mask operation is to be carried out, the write operation can be forced to be disabled by driving write control line WCTL corresponding to the relevant site to the level of ground potential Vss.

Thus, a structure is provided in which the level of read data line pair RDL, /RDL changes by not connecting read data line pair RDL, /RDL directly to the sense amplifier node of a corresponding sense amplifier circuit, and driving the gates of transistors 2010 and 2012 in response to the potential level of the sense amplifier node. Accordingly, a read operation is allowed without destroying data even in the case selection of a memory cell column by a column address signal, i.e. a select operation of any of sub read source line SRGL, overlaps, or is carried out before the amplify operation. As a result, the readout operation can be speeded. Furthermore, the operating current peak can be suppressed to reduce power consumption and noise since the sense amplifier is to be rendered active for every restricted region.

By the structure of arranging read data line pair RDL, /RDL for every four sense amplifier circuits 130 and arranging write data line pair WDL, /WDL for every 8 sense amplifier circuits, the total number of write data line pairs WDL, /WDL provided as common global data lines on memory cell array 40 can be reduced to half the total number of read data line pairs RDL, /RDL. Therefore, the wiring pitch of write data line pairs WDL, /WDL can be alleviated. Thus, the parasitic capacitance of write data line pair WDL, /WDL can be reduced.

Since a write signal is driven at the full amplitude in write data line pair WDL, /WDL in a write operation, reduction in power consumption can be particularly expected by the smaller parasitic capacitance, in addition to high speed operation by the speedy write data transmission operation.

The wiring pitch of the data line pairs can be alleviated by increasing the number of sense amplifier circuits corresponding to one data line pair, i.e. the number of memory cell columns for one data line pair. However, this alleviation in the wiring pitch will result in increase in the number of main YS lines MYSL (read source line RGL and write activation line WRL) and sub YS lines (sub read source line SRGL and sub write activation line SWRL) shown in FIG. 2. This means that increase in the number of memory cell columns corresponding to one data line pair oppresses the layout area. Semiconductor memory device 1000 of the first embodiment is directed to achieve a trade off between reduction of parasitic capacitance in the data line pair and increase of the signal lines by differentiating the number of memory cell columns corresponding to a set of read data line pair RDLP and a set of write data line pair WDLP.

Redundancy repair control in semiconductor memory device 1000 will be described with reference to FIG. 5.

Figure 5:
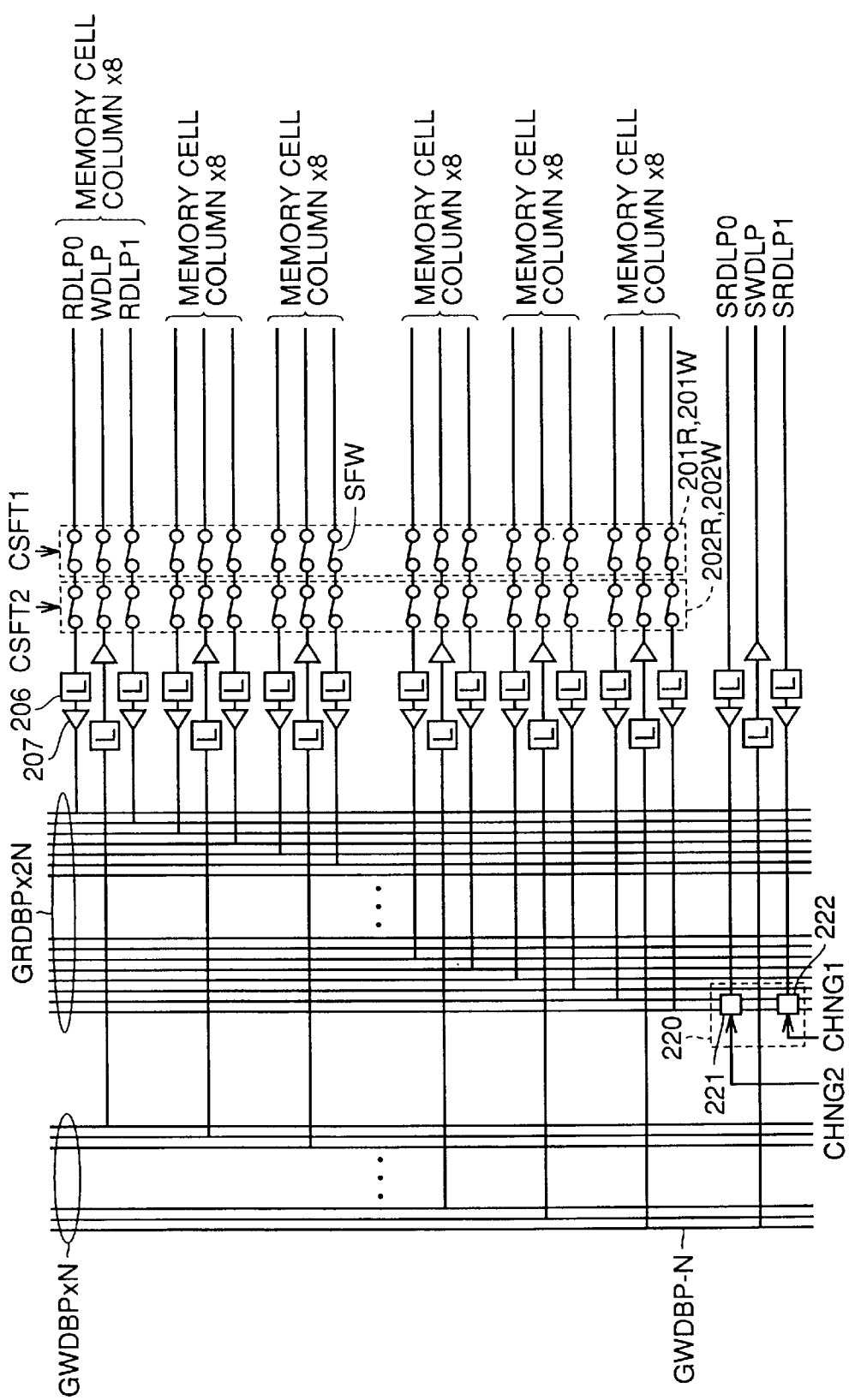
FIG. 5 is a diagram to describe redundancy repair control in semiconductor memory device 1000.

In FIG. 5, each data line pair is represented as one line. As described previously, one set of write data line pair WDLP and two sets of read data line pairs RDLP0, RDLP1 are arranged for every eight memory cell columns.

The total of N sets (N: natural number) of global write data bus pairs GWDBP are provided so as to correspond to respective write data line pairs arranged on the memory cell array. Similarly, a total of 2·N sets of global read data bus pairs GRDBP are provided. More specifically, in the entire memory cell block 100 where the regular memory cell array is arranged, the total of N sets of write data line pairs WDLP and the total of 2·N sets of read data line pairs RDLP are provided.

Similarly in spare memory cell array 45, one set of spare write data line pair SWDLP and two sets of spare read data line pairs SRDLP0, SRDLP1 are arranged for every eight memory cell columns. In the following, the spare write data line pair and the spare read data line pairs are generically represented as a spare data line group. The example of FIG. 5 shows a spare memory cell array 45 with eight memory cell columns. Therefore, redundancy repair in semiconductor memory device 1000 is executed by a spare write data line pair SWDLP and spare read data line pairs SRDLP0, SRDLP1.

Data line connection select circuit 200 shown in FIG. 2 includes first shift circuits 201R, 201W, second shift circuits 202R, 202W, and a connection switch circuit 220. Although first shift circuits 201R and 201W are shown integrally in FIG. 5, first shift circuit 201R includes a shift switch SFW arranged between a read data line pair and a global read data bus pair, whereas first shift circuit 201W includes a shift switch SFW arranged between a write data line pair and a global write data bus pair. Second shift circuits 202R and 202W have a similar structure. In the following, the circuit such as the first and second shift circuits to carry out a shift operation between a data line group and a data bus group is also generically represented as a shift circuit.

Shift circuits are arranged in series between the data line group and the data bus group corresponding to respective data read system and data write system. The number of stages of the shift circuits arranged in series corresponds to the greater of the number of the spare write data line pairs and the spare read data line pairs arranged in spare memory cell array 45. In the configuration of FIG. 5, the number of spare read data line pairs is greater than the number of spare write data line pairs. More specifically, two sets of spare read data line pairs are arranged. Therefore, first shift circuits 201R, 201W and second shift circuits 202R, 202W are arranged in two stages as to the shift circuits. The present invention is not limited to the case of FIG. 5 where two stages of shift circuits are provided. More specifically, a greater number of memory cell columns can be arranged in spare memory cell array 45 and provide a greater number of spare data line groups, and increase the stages of the shift circuits accordingly. This provides the advantage that redundancy repair can be carried out for more defective portions.

First shift circuits 201R, 201W execute a shift operation according to a common shift control signal CSFT1. Second shift circuits 202R, 202W execute a shift operation according to a common shift control signal CSFT2.

Figure 6:
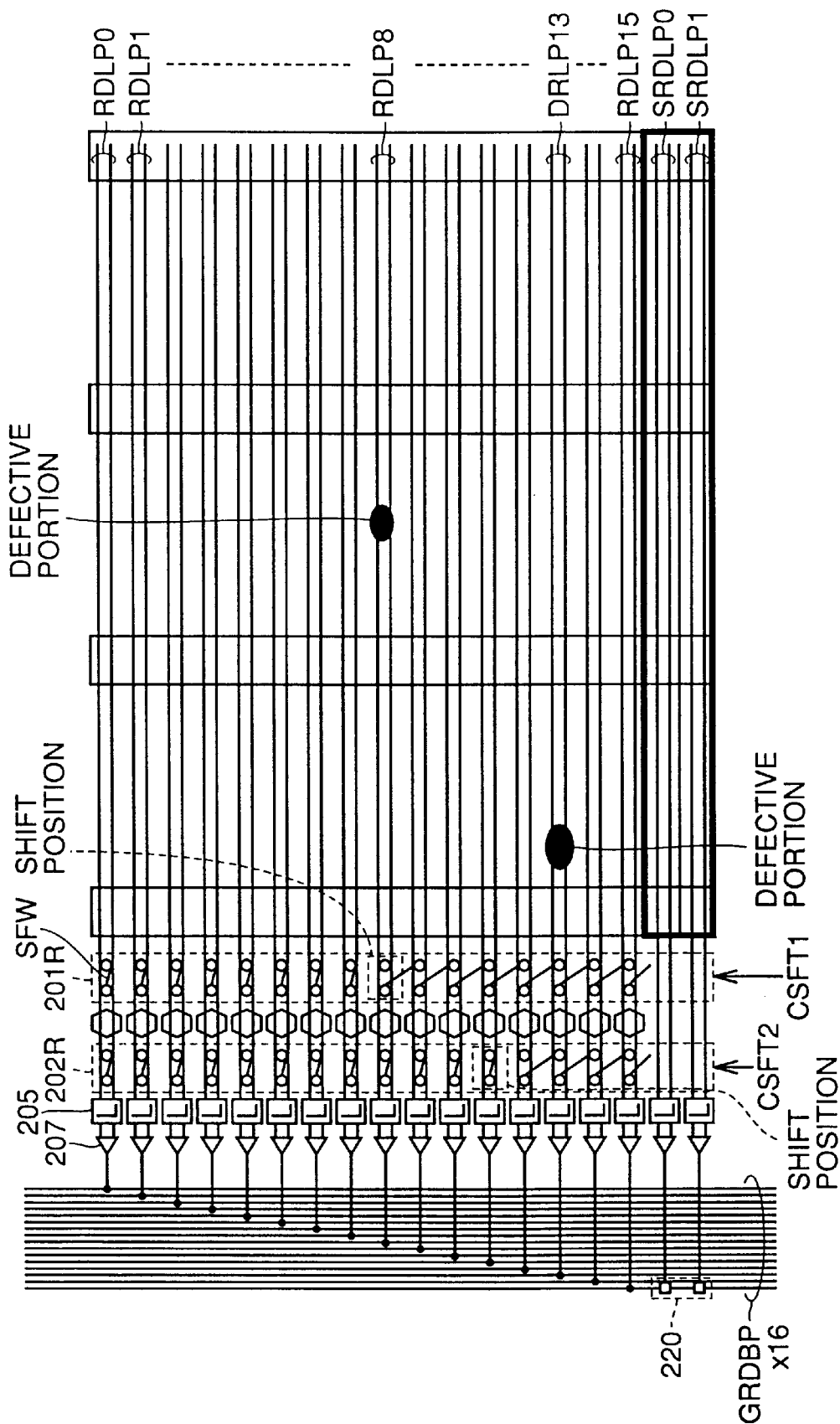
FIG. 6 is a diagram to describe the concept of redundancy repair by a shift operation.

FIG. 6 is a diagram to describe the concept of redundancy repair by a shift operation.

Referring to FIG. 6, first and second shift circuits 201R and 202R are connected to global read data bus pairs without shifting the read data line pair in a normal operation. However, when a defective portion is present, measures are taken to disconnect the read data line pair corresponding to the defective portion from the global read data bus pair. To this end, each shift circuit decodes a shift control signal to recognize the shift position, and shifts the data connection relationship between the read data line pair and the global read data bus pair at the threshold of the shift position.

For the sake of simplification, a structure in which a total of 16 sets of global read data bus pairs are provided is shown in FIG. 6. In this case, read data line pairs RDLP0–RDLP15 are arranged corresponding to memory cell block 100, and spare read data line pairs SRDLP0 and SRDLP1 are arranged corresponding to spare memory cell array 45.

As indicated by the black dot in FIG. 6, there are defective portions in the regions corresponding to read data line pair RDLP8 and read data line pair RDLP13. First shift circuit 201R connects read data line pair RDLP9 to the global read data line pair corresponding to the original read data line pair RDLP8 in order to cancel the connection between read data line pair RDLP8 and the global read data bus pair. First shift circuit 201R shifts the read data line pairs of RDLP9 and et seq. to the upper side one by one from the border of the shift position specified by control signal CSFT1.

A shift operation is also carried out to cancel the connection between read data line pair RDLP13 and the global read data bus pair since there is a defective portion corresponding to read data line pair RDLP13. This shift operation is executed by second shift circuit 202R. More specifically, second shift circuit 202R shifts the connection correspondence between read data line pairs RDLP14, RDLP15 and the global read data bus pair by one to the upper side than the original one.

Although read data line pairs RDLP0–RDLP7 read out data with respect to the original corresponding global read data bus by the shift operations of first and second shift circuits 201R and 202R, the read data of read data line pair RDLP8 will not be transmitted to the global read data bus pair.

The read data of read data line pairs GRDLP9–GRDLP12 are transmitted to a global read data bus pair that is shifted by one than the original corresponding global read data bus pair. The data of read data line pair RDLP13 corresponding to the defective portion is also not transmitted to the global read data bus pair. The read data of read data line pairs RDLP14, RDLP15 are shifted two pairs from the original corresponding global data bus pair, to be transmitted to the global read data bus pair corresponding to original read data line pairs RDLP12, RDLP13.

By such a shift operation, the read data of the read data line pair corresponding to the defective portion will not be transmitted to the global is read data bus pair. These defective portions are repaired by spare block 210 in the spare memory cell array, whereby the corresponding data is read out to spare read data line pairs SRDLP0 and SRDLP1.

Connection between a spare read data line pair and a global read data bus pair is carried out by a connection switch circuit 220 without the means of a shift circuit. Accordingly, data stored in spare block 210 is read out with respect to the global read data bus pair to which data was not read out by the shift of the read data line pair. By such a series of operation, redundancy repair of a memory cell column is carried out.

Shift control signals CSFT1 and CSFT2 specifying the shift position of first and second shift circuits 201R and 202R are generated by redundancy determination circuit 35. Shift control signals CSFT1 and CSFT2 are entered from an external source together with the defective address in programming the redundancy repair to be stored in redundancy determination circuit 35.

By such a structure, the shift position can be specified arbitrarily for each defective column address. Specification of the shift position in each shift circuit can be altered dynamically by shift control signals CSFT1 and CSFT2. Accordingly, a plurality of memory cell blocks 100 can be subjected to redundancy repair corresponding to the same spare block 210 to improve the repair efficiency. Since redundancy repair is carried out on a data line basis instead of replacement for each column address of memory cells, the redundancy repair operation of the column system can be carried out efficiently based on the structure of arranging a plurality of data line groups.

Since shift control of the data lines arranged corresponding to spare memory cell array 45 is not carried out, the shift operation can be controlled independently for each hierarchy YS line, i.e., for each unit corresponding to sub YS driver 175 shown in FIG. 2. Thus, replacement repair of the defective portion can be carried out for each region corresponding to sub YS driver 175 over memory cell blocks 100 by contemplating data for both data reading and writing.

Redundancy repair control in data readout will be described with reference to FIG. 5 again. The read data transmitted through first and second shift circuits 201R and 202R is latched by latch circuit 206 and amplified by a signal buffer 207 to be transmitted to global read data bus pair GRDBP.

Spare read data line pairs SRDLP0 and SRDLP1 are connected to two global read data bus pairs GRDBP via connection switch circuit 220 without the means of first and second shift circuits 201R and 202R. Spare read data line pair SRDLP0 can read out data to one of the two global read data bus pairs GRDP through connection switch unit 221. Similarly, spare read data line pair SRDLP1 can transmit read data to one of the two relevant global read data bus pairs through connection switch unit 221.

The number of global read data bus pairs connected to connection switch circuit 220 corresponds to the number of the spare read data line pairs. In other words, the two relevant global read data bus pairs connected to connection switch circuit 220 in the structure of FIG. 5 correspond to the global read data bus pair to which data is not transmitted from the data line pair when a shift operation is executed by both first shift circuit 201R and second shift circuit 202R.

By such a structure, connection can be provided between 2·N sets of read data line pairs RDLP and 2·N sets of global read data bus pairs GRDBP with the portion corresponding to the defective portion shifted. As to the global read data bus to which data is not transmitted from read data line pair RDLP by the shift operation, read data can be transmitted from one or both of spare read data line pairs SRDLP1 and SRDLP2 by connection switch circuit 220.

In a data write mode, the data transmitted to global write data bus pair GWDBP is transmitted to first and second shift circuits 201W and 202W via latch circuit 206 and signal buffer 207. First and second shift circuits 201W and 202W decode shift control signals CSFT1 and CSFT2, respectively, from redundancy determination circuit 35 to execute a shift operation. Therefore, when data writing with respect to a defective portion is designated, write data is not transmitted to the corresponding write data line pair WDLP. In this case, the data not transmitted to memory cell block 100 is transmitted to the last global write data bus pair GWDBP-N out of the N sets of global write data bus pairs GWDBP. The write data transmitted to global write data bus pair GWDBP-L is stored in spare memory cell array 45 via latch circuit 206 and signal buffer 207. Accordingly, the data corresponding to the defective portion is stored in spare block 210 in spare memory cell array 45 to be read out when necessary.

Figure 7:
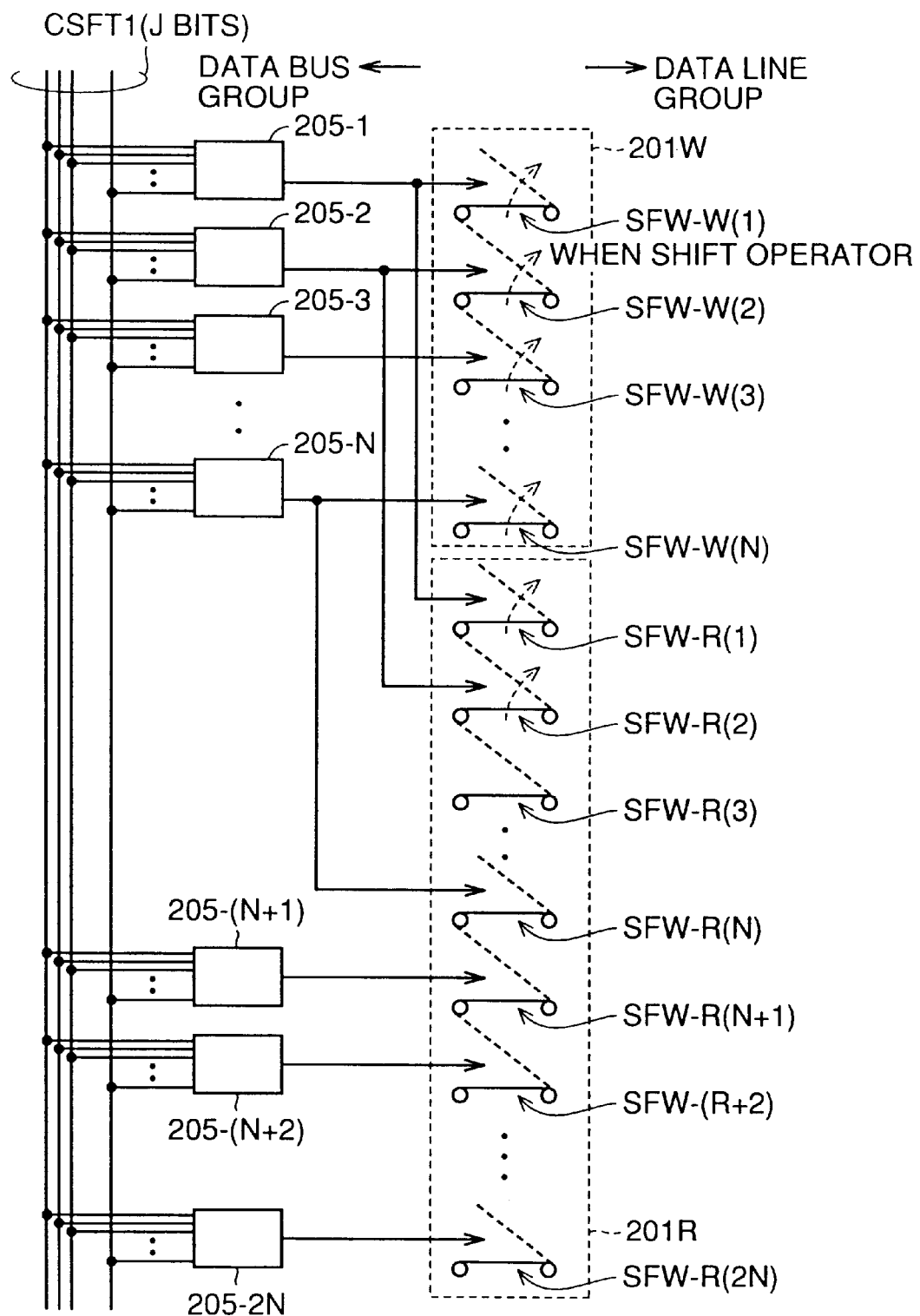
FIG. 7 is a block diagram showing a structure of a shift circuit.

A specific structure of the shift circuit will be described with reference to FIG. 7. In FIG. 7, the structure of first shift circuits 201R and 201W are shown as representative thereof.

Referring to FIG. 7, first shift circuit 201W of the data write system includes N shift switches SFW-W(1)–SFW-W(N) arranged between the N sets of global write data bus pairs and write data line pairs. First shift circuit 201R of the data read system includes 2·N shift switches SFW-W(1)–SFW-W(2N) arranged between the 2·N sets of global read data bus pairs and read data line pairs.

Each shift switch connects together a corresponding set of a data line group and a data bus group in the connection direction indicated by a solid line in the drawing. Upon designation of a shift operation, each shift switch shifts the connection relationship between a data line group and a data bus group according to the connection direction indicated by a dotted line in the drawing.

Designation of the connection direction with respect to each shift switch is executed by a decode signal generated by corresponding decode circuits 205-1~205-2N. Each decode circuit responds to shift control signal CSFT1 to supply a decode signal to a corresponding shift switch. Shift control signal CSFT1 is a signal of J bits (J is a natural number represented as $2^J=2\cdot N$) to specify one of 2·N shift switches at the shift position. The connection direction designated by each decode circuit at the threshold of the designated shift position differs between a normal operation/shift operation.

By setting any one bit of shift control signal CSFT1 as the bit to select either the group of the first to Nth or the group of the (N+1)th to (2N)th shift switches out of the 2·N shift switches, the shift control signal can be shared between the data read system and the data write system. Also, decode circuits 250-1~250-N corresponding to the shift switches in shift circuit 201-W of the data write system can be shared with shift circuit 201-R of the data read system.

By forming data line connection select circuit 200 including first shift circuits 201R, 201W, second shift circuits 202R, 202W, connection switch circuit 220, latch circuit 206 and signal buffer 207, redundancy determination circuit 35 can be shared even in the case where the number of read data line pairs and the number of write data line pairs provided corresponding to the same number of memory cell columns differ. Particularly in data reading and data writing, the control signal and the decode circuit can be shared to carry out redundancy repair control by shift redundancy efficiently.

Modification of the First Embodiment

Figure 8:
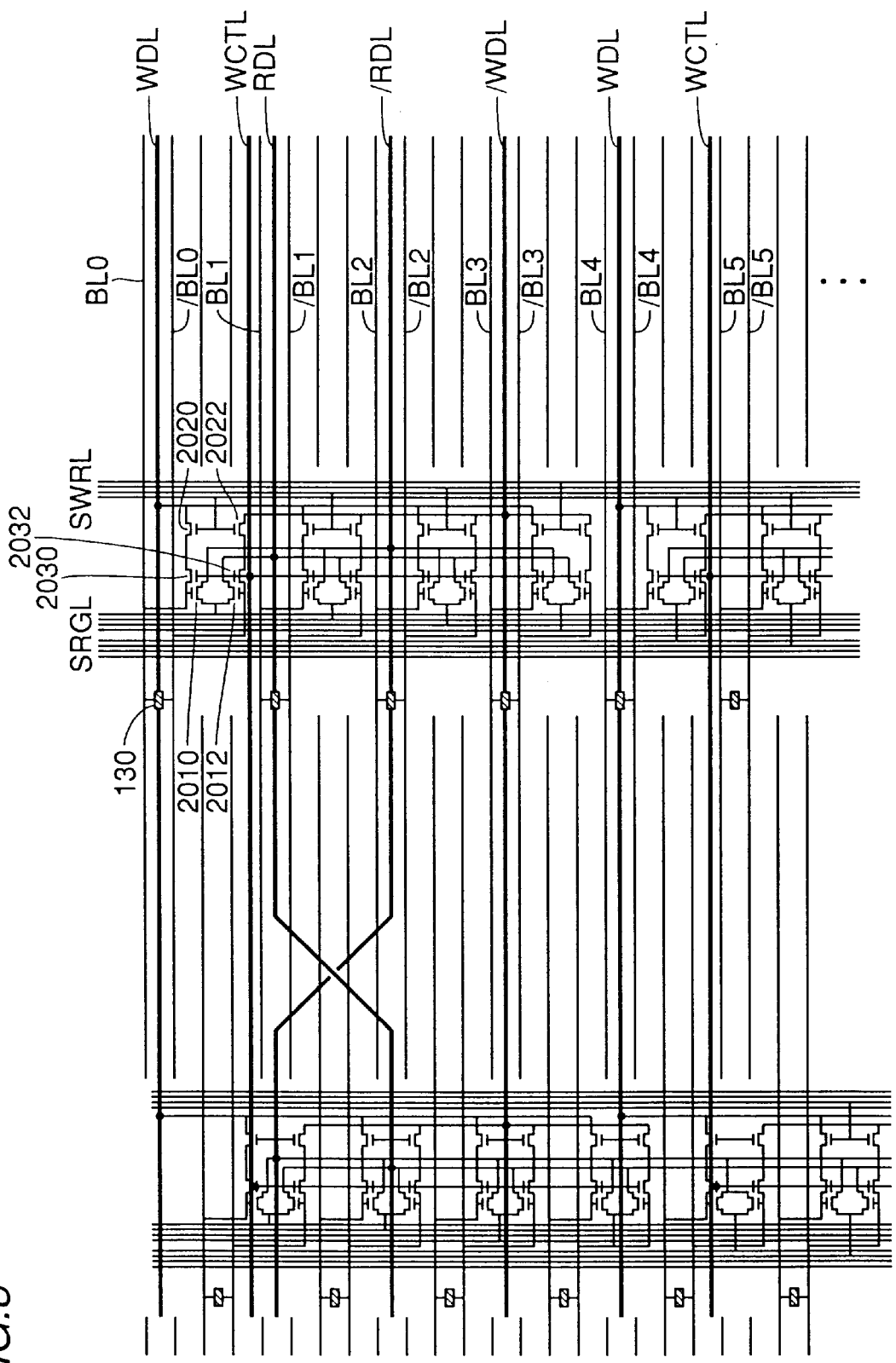
FIG. 8 is a circuit diagram to describe arrangement of a data line group in memory cell block 100 according to a modification of the first embodiment.

FIG. 8 is a circuit diagram to describe arrangement of a data line group in memory cell block 100 according to a modification of the first embodiment.

FIG. 8 corresponds to the case where L=8 and M=4, opposite to those in FIG. 4. More specifically, one set of read data line pair RDL, /RDL and two sets of write data line pairs WDL, /WDL are arranged corresponding to eight memory cell columns. Accordingly, there are arranged eight sub read source lines SRGL0–SRGL7 generically represented as sub read source line SRGL, and four sub write activation lines SWRL0–SWRL3 generically represented as sub write activation line SWRL. The remaining structure and operation are similar to those of FIG. 4. Therefore, description thereof will not be repeated.

By the above structure of the modification of the first embodiment, the wiring pitch of read data line pairs RDL, /RDL can be alleviated, instead of the write data line pairs in the first embodiment shown in FIG. 4, to reduce parasitic capacitance. Since a voltage signal of a small amplitude for amplification at the read amplifier is transmitted to read data line pair RDL, /RDL, reduction in parasitic capacitance is particularly advantageous in increasing the speed of the operation.

By virtue of a structure according to the first embodiment or the modification of the first embodiment, the wiring pitch can be alleviated to reduce the parasitic capacitance while avoiding significant increase of the signal lines for column selection as to either the read data line pair or the write data line pair. Determination of whether the read data line pair or write data line pair is to be alleviated in wiring pitch is made depending upon whether increase in the operation speed and reduction in power consumption for data writing or increase of the operation speed for data reading is of more importance.

Redundancy repair control corresponding to a memory cell array according to the modification of the first embodiment will be described with reference to FIG. 9.

Figure 9:
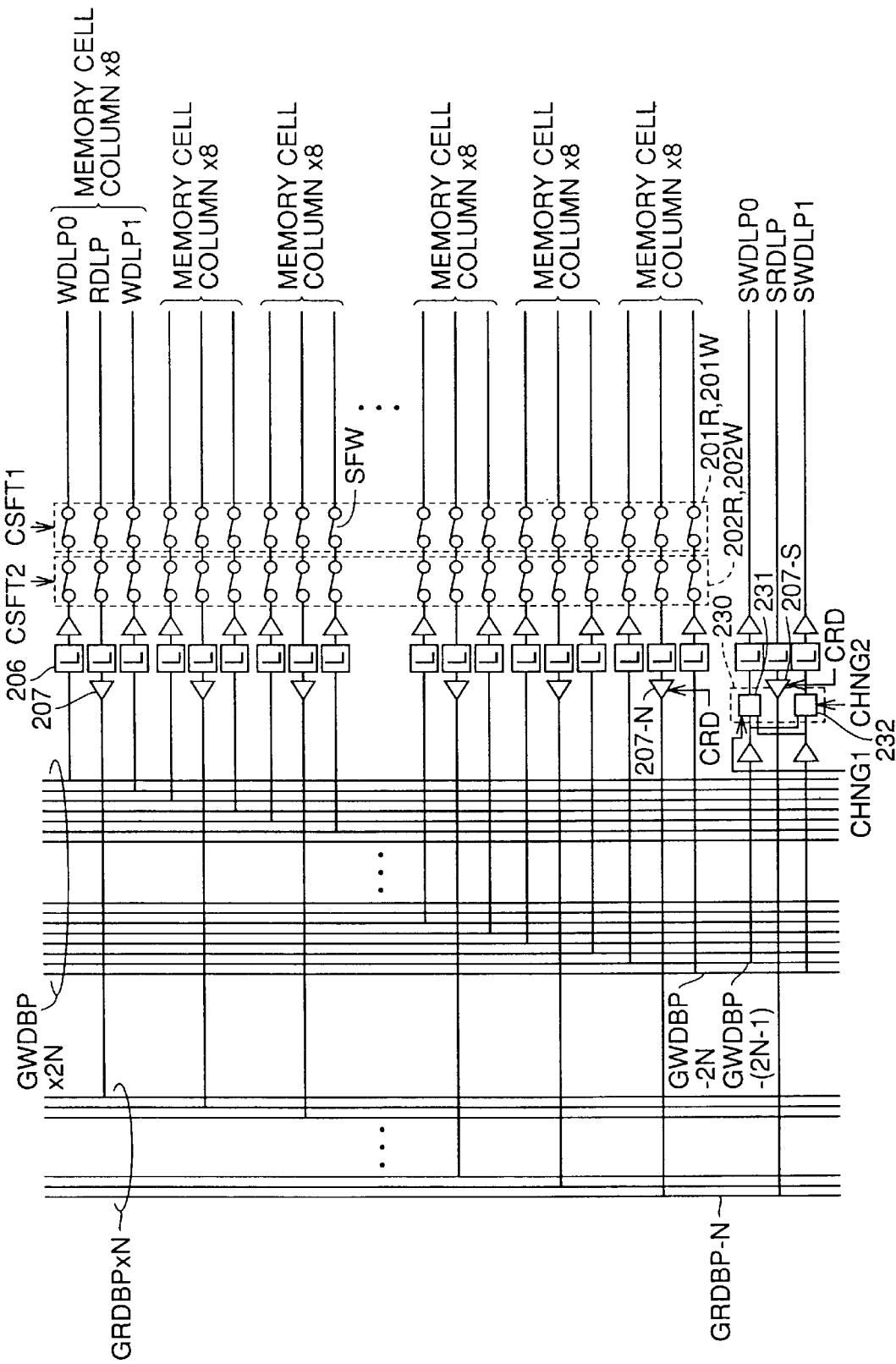
FIG. 9 is a diagram to describe redundancy repair control corresponding to a memory cell array according to a modification of the first embodiment.

In FIG. 9, a total of 2·N sets of global write data bus pairs GWDBP and write data line pairs WDLP, and also a total of N sets of global read data bus pairs GRDBP and read data line pairs RDLP are provided, opposite to those of FIG. 5.

Similarly in spare memory cell array 45, two sets of spare write data line pairs SWDLP0, SWDLP1 and one set of the spare read data line pair SRDLP are arranged for every 8 memory cell columns. FIG. 9 shows the example where spare memory cell array 45 includes 8 memory cell columns. Therefore, redundancy repair is executed by spare write data line pairs SWDLP0, SWDLP1 and spare read data line pair SRDLP.

As in the case of FIG. 5, first shift circuits 201R, 201W and second shift circuits 202R, 202W are provided between the data line group and the data bus group. The structure and arrangement of these shift circuits and the decode of the shift position by a shift control signal correspond to those described with reference to FIGS. 5 and 6, provided that the data read system and the data write system are exchanged. The basic operation of each shift circuit is as described in FIG. 6. Therefore, detailed description thereof will not be repeated.

In the structure of FIG. 9, a connection switch circuit 230 is provided instead of connection switch circuit 220 of FIG. 5. The number of global write data bus pairs connected to connection switch circuit 230 corresponds to the number of the spare write data line pairs. More specifically, in the structure of FIG. 9, global write data bus pairs GWDBP-2N and GWDBP-(2N−1) connected to connection switch circuit 230 correspond to the global write data bus pair having a write data line pair to which data is not transmitted when a shift operation is executed by both first and second shift circuits 201W and 202W.

Connection switch circuit 230 is provided between global write data bus pairs GWDBP-2N and GWDBP-(2N−1) and spare write data line pairs SWDLP0 and SWDLP1. Connection switch circuit 230 includes connection switch units 231 and 232 to allow the write data transmitted to global write data bus pairs GWDBP-2N and GWDBP-(2N−1) to any spare write data line pair SWDLP0, SWDLP1.

By the above structure, connection between 2·N sets of write data line pairs WDLP and 2·N sets of global read write bus pairs GWDBP can have the portion corresponding the defective portion shifted. The data that was not transmitted to the write data line pair WDLP by the shift operation is transmitted to spare write data line pair SWDLP0 or SWDLP1 by connection switch circuit 230.

In order to execute redundancy repair control related to data readout, control is provided by a redundancy determination signal CRD with respect to a signal buffer 207-N corresponding to global read data bus pair GRDBP-N and a signal buffer 207-S corresponding to spare read data line pair SRDLP. Here, global read data bus pair GRDBP-N corresponds to the global read data bus pair to which read data is not transmitted from read data line pair when a shift operation is executed by the shift circuit.

In the case where a shift operation is executed for redundancy repair in a data readout mode, signal buffer 207-N is rendered inactive whereas signal buffer 207-S is rendered active. In response, read data is transmitted from (N−1) sets of read data line pairs excluding the read data line pair corresponding to the defective portion to the (N−1) sets of global read data bus pairs excluding global read data bus pair GWDBP-N. Global read data bus pair GWDBP-N that does not receive data from the corresponding read data line pair receives the read data from spare read line pair SRDLP via signal buffer 207-S.

In the case where redundancy repair is not required and shift operation for redundancy repair is not executed, signal buffer 207-N is rendered active, and the data of the N sets of read data line pairs are directly transmitted to all the N sets of global read data bus pairs GRDBP. By rendering signal buffer 207-S inactive, read data from spare memory cell array 45 is prevented from being transmitted to the global read data bus pair.

FIG. 9 corresponds to the case where one spare read data line pair is arranged in the spare memory cell array. In the case where K sets (K: natural number of at least 2) of spare read data line pairs are provided, a signal buffer under control of the redundancy determination circuit is arranged between respective K sets of read data line pairs and K sets of global read data bus pairs GRDBP, and between K sets of spare read data line pairs and K sets of global read data bus pairs GRDBP, wherein the redundancy determination circuit selectively renders active K signal buffers out of the 2·K signal buffers according to redundancy repair control.

According to such a structure, redundancy determination circuit 35 can be shared even in the case where the wiring pitch of read data line pairs RDL, /RDL is alleviated. The control signal and decoder can be shared in both a data read operation and a data write operation to carry out redundancy repair control by shift redundancy.

Second Embodiment

The previous first embodiment is directed to a structure alleviating the wiring pitch in the horizontal direction to suppress parasitic capacitance in the global data lines arranged on memory cell array 40. The present second embodiment is directed to a structure suppressing parasitic capacitance by alleviating the wiring pitch of the data lines formed on the semiconductor substrate in the height direction.

Figure 10:
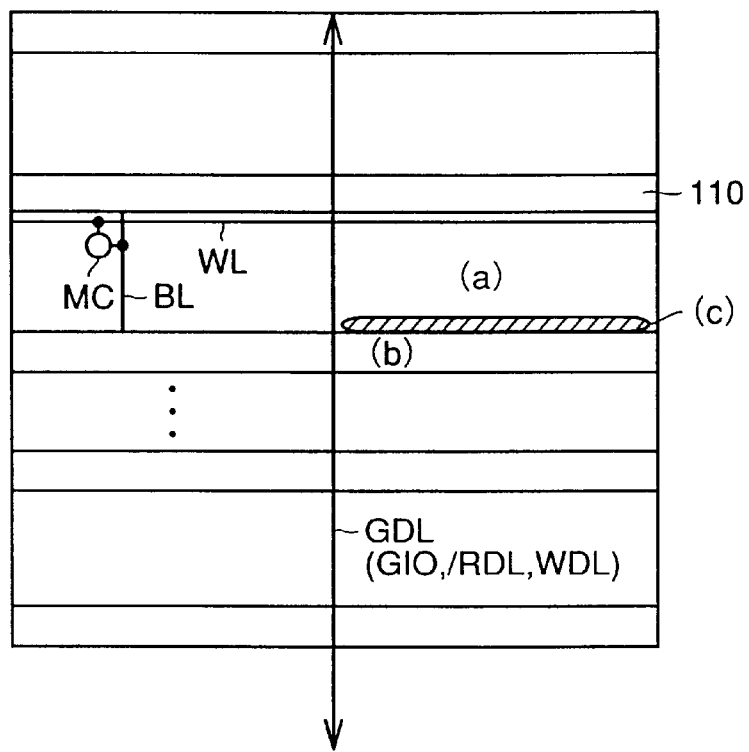
FIG. 10 schematically shows a structure of a memory cell array 40.

Referring to FIG. 10, a memory cell array 40 is divided into a region (a) where memory cells MC are arranged in a matrix, and a region (b) where a sense amplifier band 110 and the like are arranged at the periphery. A word line WL is arranged at each row of memory cells MC. A bit line BL is arranged corresponding to each memory cell column. A global data line GDL to transmit read/write data with respect to a memory cell is arranged traversing memory cell array 40. Global data line GDL is a generic representation of a global I/O line GIO shared between data read/data write operations, and a global read data line RDL and a global write data line WDL provided exclusively for data reading and data writing, respectively.

Figure 11:
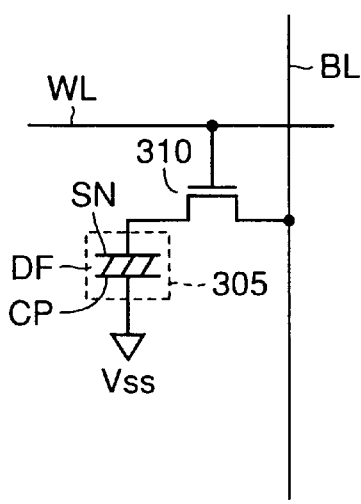
FIG. 11 is a circuit diagram showing an example of a structure of a memory cell MC.

FIG. 11 shows a memory cell structure of a 1 transistor-1 capacitor memory cell as a memory cell MC.

Referring to FIG. 11, memory cell MC includes an access transistor 310 and a capacitor 305 to store data. Capacitor 305 includes a cell plate CP and a charge storage node SN arranged opposite to each other with a dielectric film DF therebetween. Cell plate CP is shared among a plurality of memory cells, and is coupled to a common reference potential Vss. Charge corresponding to the level of the data stored in memory cell MC is accumulated in charge storage node SN. More specifically, when memory cell MC retains the data of "1", charge storage node SN maintains the charge applied by bit line BL via access transistor 310. When memory cell MC retains the data of "0", charge is not supplied to bit line BL. The charge in charge storage node SN is discharged via access transistor 310.

Referring to FIG. 10 again, the structure of the semiconductor memory device on memory cell array 40 differs in the region (a), the region (b), and the region (c) at the border between regions (a) and (b) to fix the potential of cell plate CP.

Figure 12:
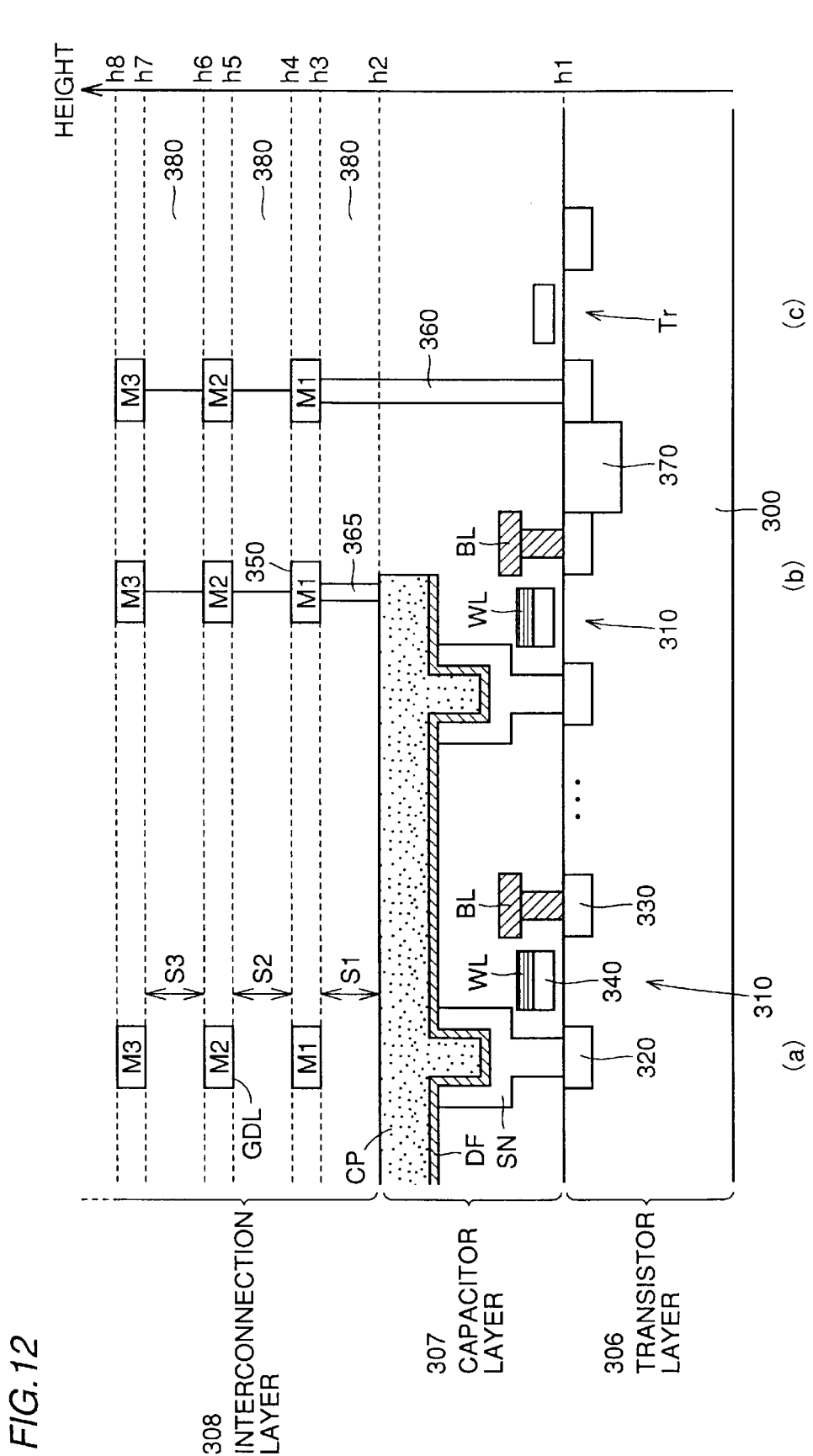
FIG. 12 is a sectional view of a general semiconductor memory device to describe the structure thereof.

FIG. 12 is a sectional view of a general semiconductor memory device to describe the structure thereof.

Referring to FIG. 12, a transistor layer 306 is provided on a main substrate 300 to the height of h1. In regions (a) and (b), a capacitor layer 307 is formed to the height of h2. Furthermore, metal interconnection layers M1 (height h3–h4), M2 (height h5–h6) and M3 (height h7–h8) are arranged thereon in common at regions (a)–(c). An insulation layer of silicon dioxide, for example, is formed between respective layers and the region where a device is not arranged.

In region (a) the transistor layer includes access transistor 310. Access transistor 310 includes source/drain regions 320 and 330, and a gate electrode 340. Gate electrode 340 is connected to word line WL. One of source/drain regions 330 is connected to bit line BL. The other of source/drain regions 320 is coupled to charge storage node SN formed at an upper layer of transistor layer 306. Cell plate CP is formed over charge storage node SN with dielectric film DF therebetween. Charge storage node SN, dielectric film DF and cell plate CP form the capacitor of memory cell MC.

Similarly in region (b), a capacitor layer 307 to form a memory cell is provided on the transistor layer where access transistor 310 is formed. The distance between the cell plate layer and metal interconnection layer M1 (the difference in the height of h2–h3) is S1. The distance between metal interconnection layer M1 and metal interconnection layer M2 (difference in height between h4–h5) is S2. The distance between metal interconnection layer M2 and metal interconnection layer M3 (difference in height between h6–h7) is S3.

First metal interconnection layer M1 generally has wiring of an extremely short distance so as to provide connection between a sense amplifier circuit and a column select gate. Global data line GDL provided traversing on the memory cell array is often arranged at second metal interconnection layer M2. A signal line to execute column selection or the like is generally arranged at third metal interconnection layer M3.

In region (b), a line 350 to fix the potential level of cell plate CP is connected to cell plate CP via a contact hole 365 formed between first metal interconnection layer M1 and capacitor layer 307. In region (c), the line corresponding to the transistor is formed through a contact hole 360 provided between first metal interconnection layer M1 and transistor layer 306. Reference number 370 designates an element isolation film.

Regarding the above-described structure, control of the fabrication process to provide a contact hole will become extremely difficult since the aspect ratio which is the vertical/horizontal dimension ratio of contact holes 360 and 365 provided with respect to first metal interconnection layer M1 differs greatly depending upon the region.

Since first metal interconnection layer M1 is provided in common in also region (a) on the memory cell, the layout in the height direction is limited to render difficult alleviation of the wiring pitch in the direction of the height of second metal interconnection layer M2 where global data line GDL is arranged. It is therefore difficult to suppress parasitic capacitance of global data line GDL.

Figure 13:
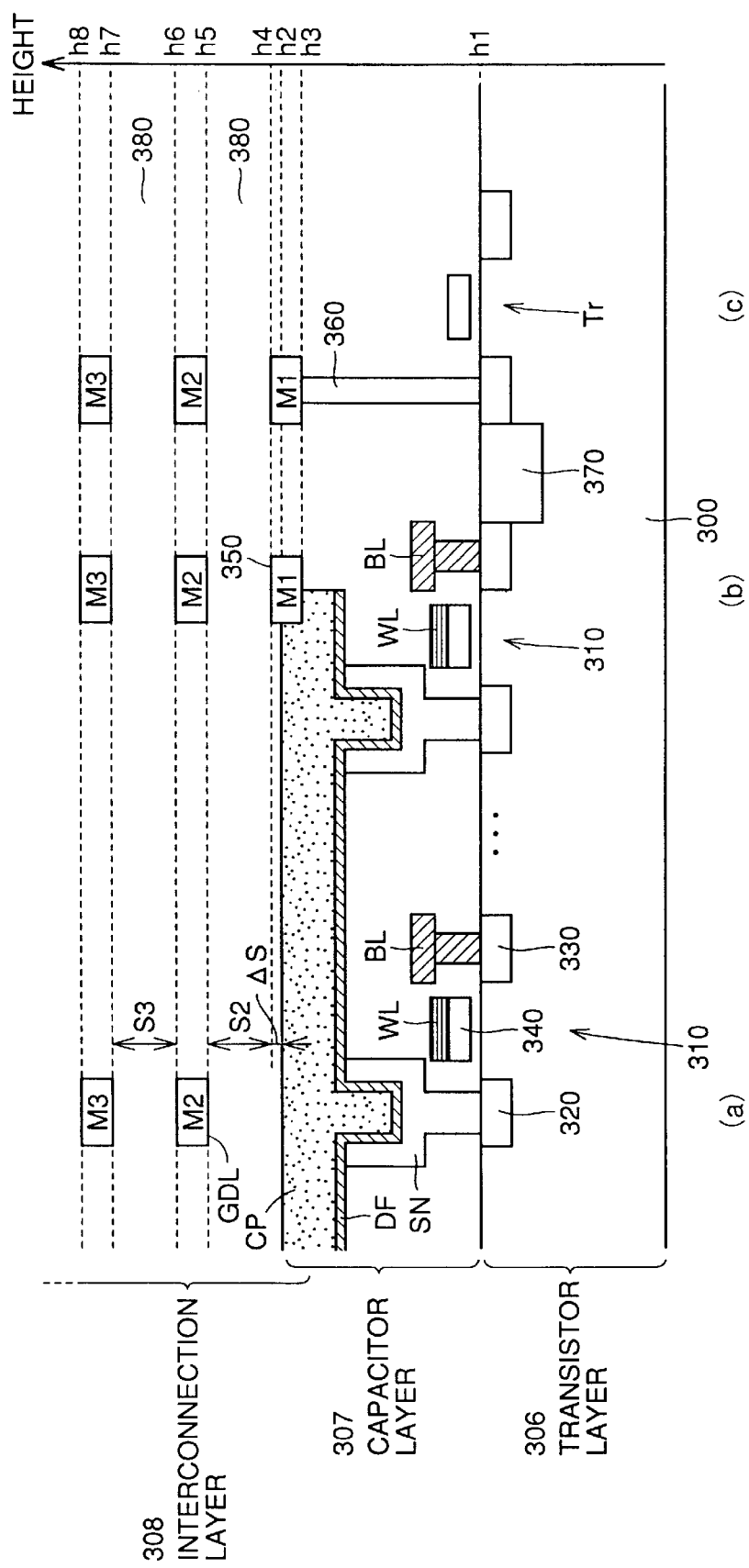
FIG. 13 is a sectional view of a semiconductor memory device according to a second embodiment of the present invention to describe a structure thereof.

Referring to FIG. 13, regions (a)–(c) correspond to regions (a)–(c), respectively, described with reference to FIGS. 11 and 12.

In region (b), line 350 to fix cell plate 350 to the reference potential is formed at first metal interconnection layer M1. In the semiconductor memory device according to the second embodiment, first metal interconnection layer M1 is arranged so as to be in flush with the layer where the cell plate is formed (also called "cell plate layer" hereinafter) in the height direction. More specifically, height h3 and height h4 corresponding to the bottom plane and the top plane of first metal interconnection layer M1 are set so that h3<h2 and h4>n2. Accordingly, line 350 to fix cell plate CP to the reference potential is directly coupled to cell plate CP without the contact hole.

Since execution of the difficult process control of forming a contact hole having an aspect ratio greatly different from that of another is no longer required, the fabrication process can be facilitated.

Since first metal interconnection layer M1 is not provided in region (a) in the semiconductor memory device of the second embodiment, the wiring pitch in the height direction of second metal interconnection layer M2 (from cell plate CP) where global data line GDL is formed, the pitch can be increased from S2 to S2+ΔS. Here, the difference ΔS corresponds to the difference between the top surface of cell plate layer CP (height h2) and the top surface of first metal interconnection layer M1 (height h4).

Accordingly, the parasitic capacitance of second metal interconnection layer M2 where global data line GDL is formed can be reduced than the case of FIG. 12. As a result, the advantages of increase in the data read/write operation, particularly reduction in power consumption in a write operation, can be provided.

Formation of first metal interconnection layer M1 of FIG. 13 in region (b) will be described hereinafter with reference to FIGS. 14 and 15A–15D.

Figure 15A:
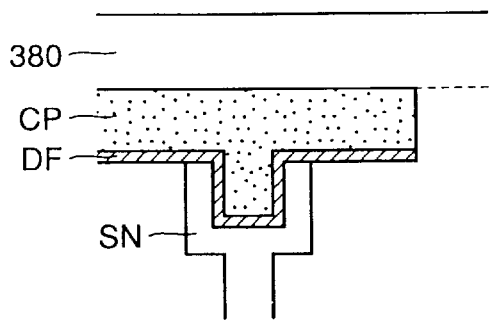
FIGS. 15A–15D are diagrams to describe the concept of the flow chart of FIG. 14.
Figure 15B:
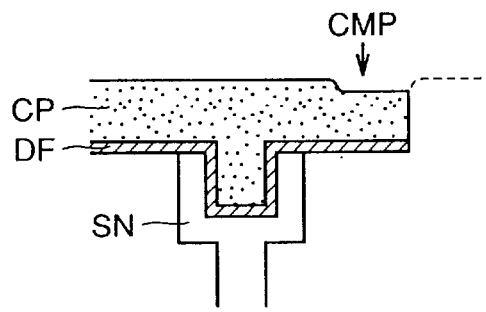

A transistor layer is formed on semiconductor substrate 300 (step S100). After an interconnection layer of cell plate CP is formed thereon (step S110), an interlayer insulation (silicon dioxide) layer 380 is formed thereon (step S120), as shown in FIG. 15A.

Then, the region where line 350 to fix cell plate CP to the reference potential is provided is ensured by grinding a portion of cell plate CP. In the fabrication method of FIG. 14, an interlayer insulation layer 380 to form first metal interconnection layer M1 is ground by chemical mechanical polishing (CMP) (step S130a). The grinding process by CMP is executed by removing the interconnection layer of cell plate CP in the region where metal interconnection layer M1 is formed. Following the grinding process by CMP, a metal film 390 to provide metal interconnection layer M1 is formed by sputtering, for example, as shown in FIG. 15C (step S140a).

Figure 15C:
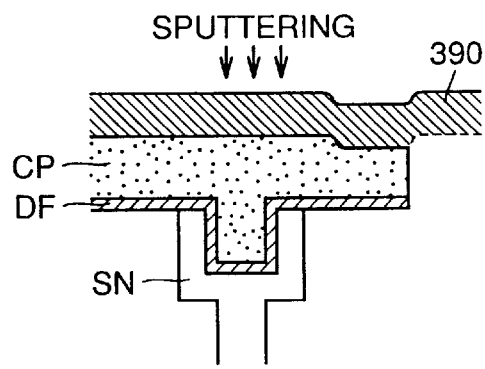
Figure 15D:
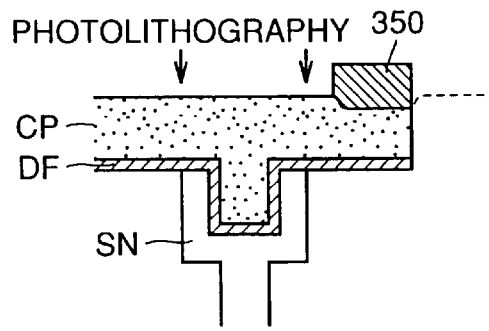

The metal film is subjected to wire pattering by photolithography. Resist stripping by etching is carried out for the potential not corresponding to the pattern (step S150a). Accordingly, line 350 can be formed at first metal interconnection layer M1 (step S200). Thus, line 350 to fix cell plate CP to the reference potential is formed integrally with cell plate CP as shown in FIG. 15D.

The amount of grinding by CMP (step S120) is controlled so that the difference between the top surface of metal interconnection layer M1 and the top surface of cell plate CP corresponds to ΔS.

Formation of the metal interconnection layer described with reference to FIGS. 14 and 15A–15D is carried out with respect to a metal of a relatively large grain such as aluminum alloy.

Another example of the fabrication method of first metal interconnection layer M1 according to the second embodiment will be described with reference to FIGS. 16 and 17A–17D. This example corresponds to the case where the metal line is formed as a trench embedded wiring by damascene working.

Formation of transistor layer 306 (step S100), formation of interconnection layer of cell plate CP (step S110) and formation of an interlayer insulation (silicon dioxide) layer 380 (step S120) are similar to those described with reference to FIGS. 14 and 15A.

Figure 14:
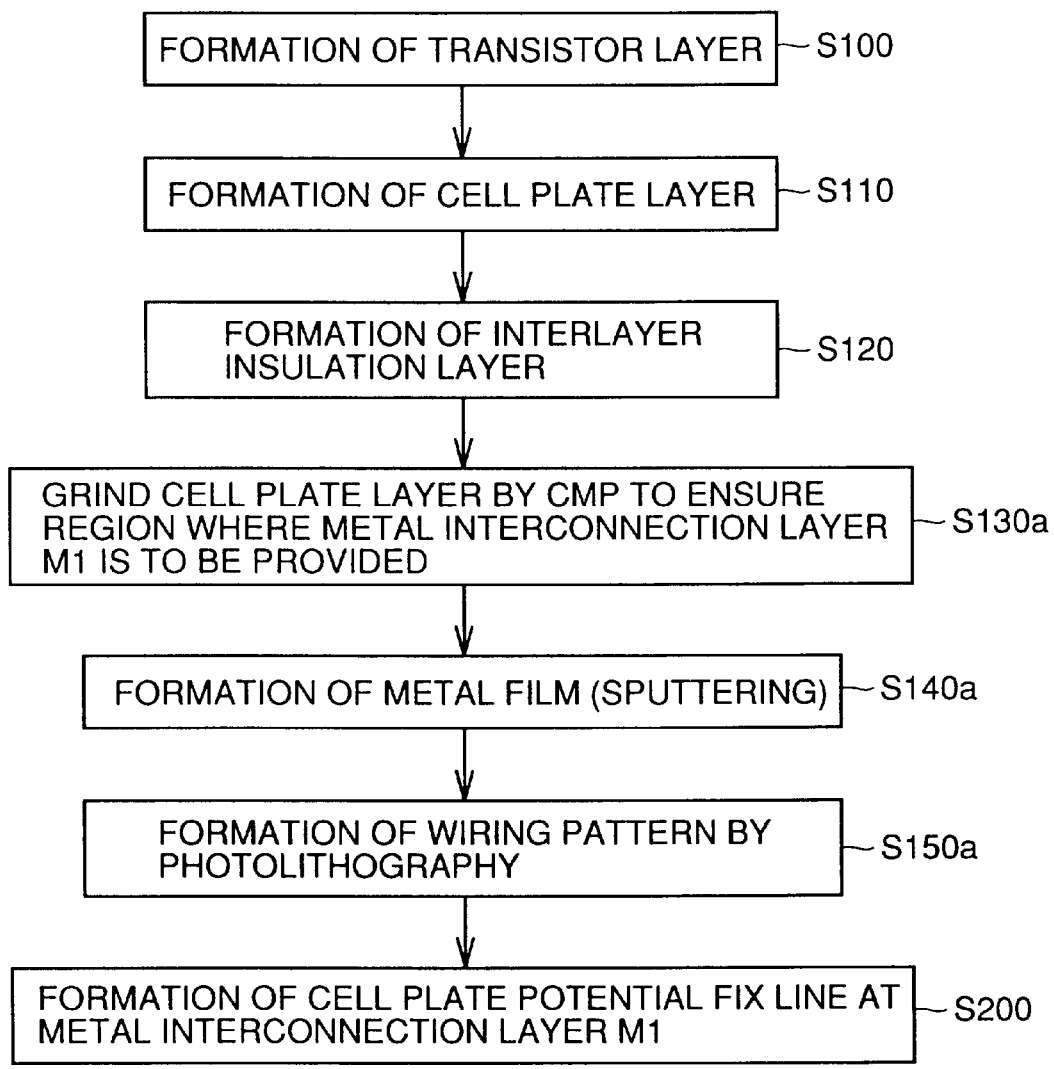
FIG. 14 is a flow chart to describe an example of a fabrication method of a first metal interconnection layer M1 according to the second embodiment.

Then, as in the fabrication method shown in FIG. 14, a region where line 350 to fix cell plate CP to the reference potential is provided is ensured by grinding cell plate CP partially. In the fabrication method of FIG. 16, the formed interconnection insulation layer has a wiring trench formed by damascene process (step S130b). As shown in FIG. 17B, the wiring trench is formed so as to cut away cell plate CP layer. Following formation of the wiring trench, a metal film 395 to form first metal interconnection layer M1 is formed by, for example, chemical vapor deposition (CVD) (step S140b). Following formation of the metal film, grinding by CMP is effected, whereby the metal film is removed from the region other than the region of the wiring trench (step S150b). Accordingly, line 350 to fix the potential of the cell plate can be formed integrally with cell plate CP at first metal interconnection layer M1 (step S200), as shown in FIG. 17D.

Figure 16:
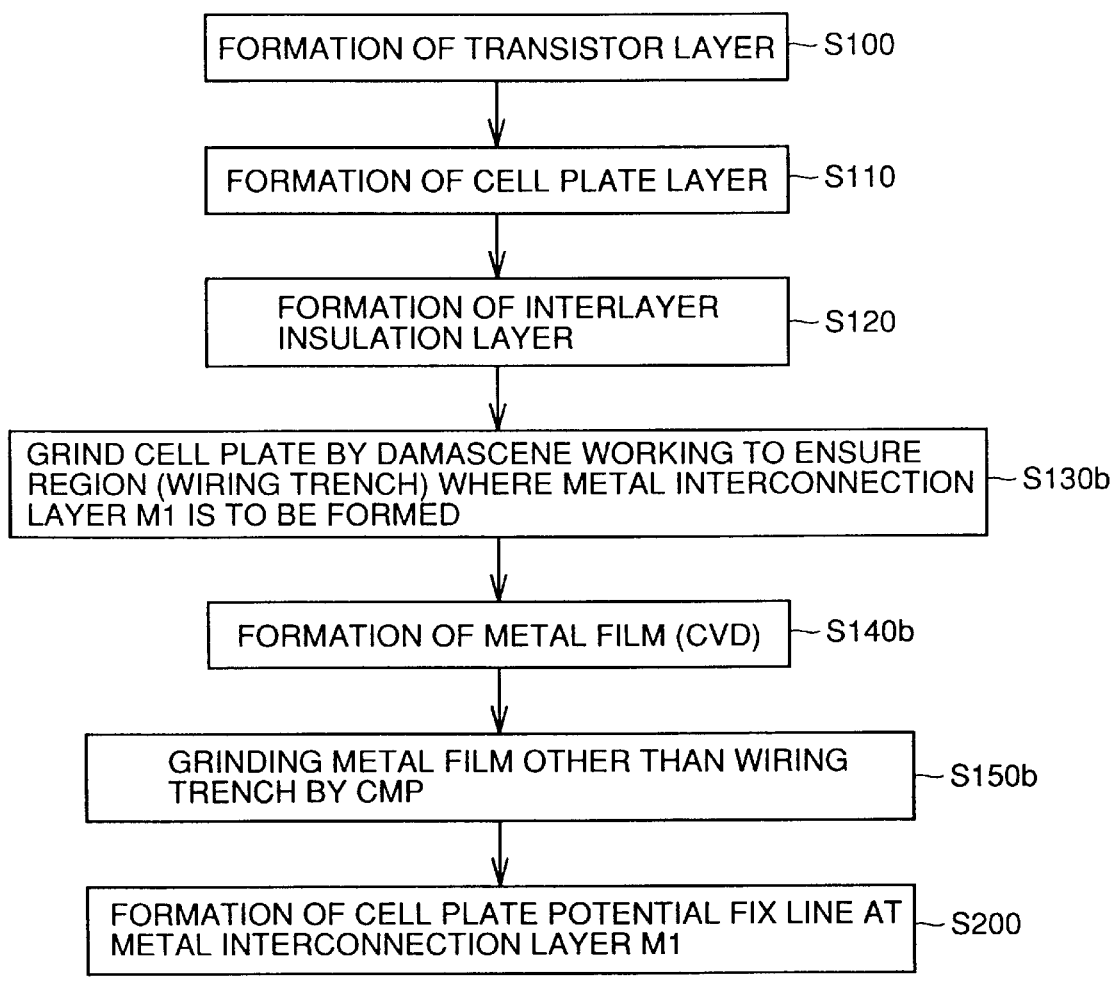
FIG. 16 is a flow chart to describe another example of a fabrication method of first metal interconnection layer M1 according to the second embodiment.
Figure 17A:
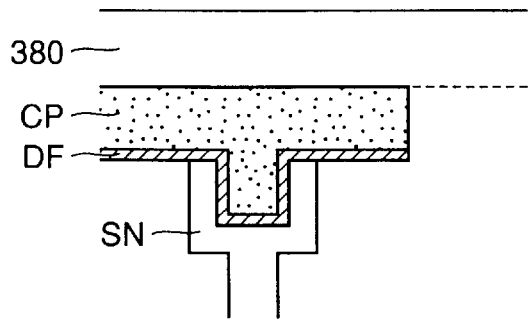
FIGS. 17A–17D are diagrams to describe the concept of the flow chart of FIG. 16.
Figure 17B:
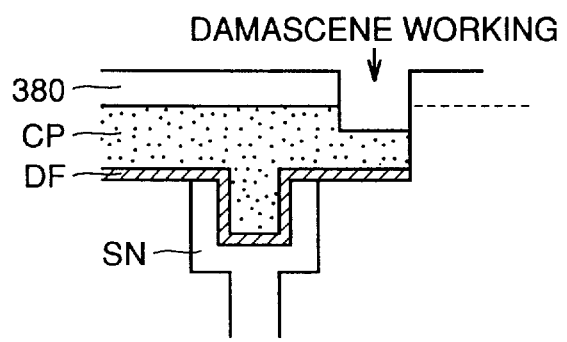
Figure 17C:
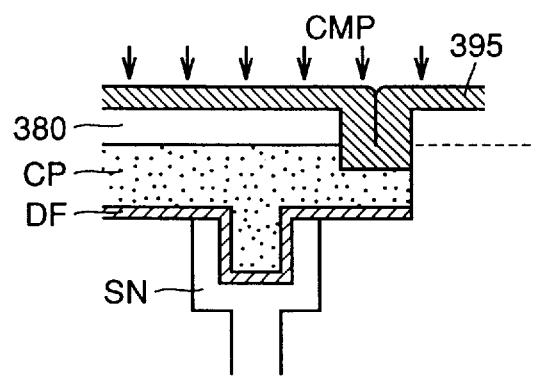
Figure 17D:
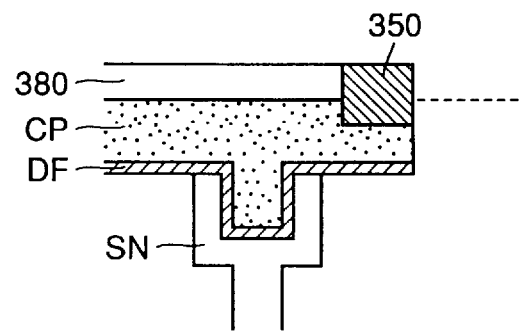

In other words, the fabrication method of a semiconductor memory device shown in FIG. 16 includes processing steps similar to those of the fabrication method of a semiconductor memory device shown in FIG. 14, provided that step 130b to ensure a region where line 350 is provided by partially grinding the cell plate, a step 140b to form a metal film, and a step 150b to form an interconnection pattern from the metal film are substituted for steps 130a, 140a, and 150a, respectively.

The difference ΔS in height between the top surface of first metal interconnection layer M1 and the top surface of cell plate CP is to be controlled by the depth of the interconnection trench in the damascene process in the fabrication method of the semiconductor memory device shown in FIGS. 16 and 17.

Formation of the metal interconnection layer shown in FIGS. 16 and 17 is employed in the case of forming wiring by metal of a relatively small grain that allows microfabrication such as Cu (copper), for example.

By the fabrication method of a semiconductor memory device described with reference to FIG. 14 or 16, line 350 to fix the potential of cell plate CP at region (b) can be formed at first metal interconnection layer M1, described in FIG. 13.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cell blocks arranged in a matrix,
   each of said plurality of memory cell blocks including a plurality of memory cells arranged in a matrix;
   a plurality of read data lines shared between a plurality of said memory cell blocks adjacent in a column direction, each read data line being arranged for every L (L is a natural number) memory cell columns to transmit read data read out from said memory cell array;
   a plurality of write data lines shared between the plurality of said memory cell blocks adjacent in the column direction, each write data line being arranged for every M (M is a natural number different from L) memory cell columns to transmit write data to be written into said memory cell array;
   a plurality of read column select lines each transmitting a read column select signal to select one said memory cell column out from said L memory cell columns in each said memory cell block;
   a plurality of write column select lines each transmitting a write column select signal to select one said memory cell column from said M memory cell columns in each said memory cell block;
   a read select gate provided for every said L memory cell columns in each said memory cell block to transmit said read data of a memory cell column selected in response to said read column select signal to a corresponding one of said plurality of read data lines; and
   a write select gate provided for every said M memory cell columns in each said memory cell block to transmit said write data transmitted by a corresponding one of said plurality of write data lines to a memory cell column selected in response to said write column select signal.

2. The semiconductor memory device according to claim 1, wherein said M is larger than said L.

3. The semiconductor memory device according to claim 1, wherein said L is larger than said M.

4. The semiconductor memory device according to claim 1, wherein said memory cell array includes a spare memory cell array,
   said spare memory cell array being divided into a plurality of spare blocks along a row direction, corresponding to a row of said memory cell blocks respectively,
   said semiconductor memory device further comprising:
   I (I is a natural number) spare read data lines shared among said plurality of spare blocks, and each arranged for every said L memory cell columns to transmit data read out from said memory cell array;
   J (J is a natural number) spare write data lines shared among said plurality of spare blocks, and each arranged for every said M memory cell columns to transmit write data to be written into said memory cell array;

a plurality of read data buses provided corresponding to said plurality of read data lines, respectively;

a plurality of write data buses provided corresponding to said plurality of write data lines, respectively;

a redundancy determination circuit comparing a prestored defective address indicating a defective portion in said plurality of memory cells with an input address to execute redundancy repair control; and a data line connection select circuit controlling a data transmission path between said plurality of read data lines and I spare read lines and said plurality of read data buses, and between said plurality of write data lines and J spare write lines and said plurality of write data buses according to said redundancy repair control.

5. The semiconductor memory device according to claim 4, wherein said M is larger than said L, wherein said data line connection select circuit comprises
I read shift circuits arranged in series between said plurality of read data lines and said plurality of read data buses, each read shift circuit capable of shifting a connection relationship between said plurality of read data lines and said plurality of read data buses at a threshold of a designated shift position;

I write shift circuits arranged in series between said plurality of write data lines and said plurality of write data buses, each write shift circuit capable of shifting the connection relationship between said plurality of write data lines and said plurality of write data buses at a threshold of a designated shift position, and a connection switch circuit that can provide connection between each said spare read line and each of I read data buses out of said plurality of read data buses under control of said redundancy determination circuit, wherein said shift position of the Kth (K is a natural number not higher than I) of said I read shift circuits and write shift circuits is specified by a common control signal generated by said redundancy determination circuit.

6. The semiconductor memory device according to claim 4, wherein said L is larger than said M, wherein said data line connection select circuit comprises
J read shift circuits connected in series between said plurality of read data lines and said plurality of read data buses, each read shift circuit capable of shifting a connection relationship between said plurality of read data lines and said plurality of read data buses at a threshold of a specified shift position, J write shift circuits arranged in series between said plurality of write data lines and said plurality of write data buses, each write shift circuit capable of shifting the connection relationship between said plurality of write data lines and said plurality of write data buses at the threshold of a specified shift position, a connection switch circuit that can provide connection between each of J write data buses and each said spare write line under control of said redundancy determination circuit, and 2·I signal buffers arranged between I of said plurality of read data lines and I of said plurality of read data buses, and between said I spare read lines and I of said plurality of read data buses, wherein said redundancy determination circuit renders I of said 2·I signal buffers active according to said redundancy repair control, wherein said shift position of the K'th (K' is a natural number not higher than I) of said J read shift circuits and write shift circuits is specified by a common control signal generated by said redundancy determination circuit.

7. A semiconductor memory device formed on a semiconductor substrate, comprising:

a memory cell array region including a plurality of memory cells arranged in a matrix,
each said memory cell including
an access transistor and a data storage capacitor;

a transistor layer formed on said semiconductor substrate, having transistors including said access transistor arranged;

a capacitor layer formed up to a first height at a top surface of said transistor layer in said memory cell array region to arrange said data storage capacitor;

a first interconnection layer formed at the top surface of said transistor layer at a height between a second height lower than said first height and a third height higher than said first height in a region outside said memory cell region;

a second interconnection layer arranged in common at said memory cell array region and said region outside said memory cell array region, at the top surface of said transistor layer, at a height between a fourth height higher than said third height and a fifth height higher than said fourth height; and a plurality of global data lines arranged at said second interconnection layer to transmit data read out and written with respect to said plurality of memory cell arrays.

8. The semiconductor memory device according to claim 7, wherein said data storage capacitor includes a cell plate fixed at a reference potential, and
a charge storage node to accumulate charge corresponding to stored data,
said cell plate formed at a top surface side of said capacitor common to said plurality of memory cells,
said semiconductor memory device further comprising a reference line provided corresponding to at least one of said plurality of memory cells, and coupled to said reference potential, wherein said reference line is arranged at said first interconnection layer provided so as to be electrically coupled directly with said cell plate.

9. A fabrication method of a semiconductor device comprising the steps of:

forming a transistor layer on a semiconductor substrate;

forming a capacitor layer on a memory cell array region;

forming an interlayer insulation film on said capacitor layer, ensuring a region where a reference line to couple a cell plate layer formed at a top surface side of said capacitor layer to a reference potential is provided by partially grinding said cell plate layer;

forming a metal film after partially grinding said cell plate layer; and working on said metal film according to a predetermined interconnection pattern to form a plurality of lines including said reference line.

10. The fabrication method of a semiconductor memory device according to claim 9, wherein said step of partially grinding said cell plate layer includes the step of grinding said interlayer insulation film, and in a region where said reference line is arranged, grinding said cell plate layer to a predetermined depth, wherein said step of working on said metal film includes the step of working on said metal film by photolithography.

11. The fabrication method of a semiconductor memory device according to claim 9, wherein said step of partially grinding said cell plate layer includes the step of forming a wiring trench of a predetermined depth to arrange said reference line in a region where said reference line is arranged, wherein said step of working on said metal film includes the step of grinding said metal film formed at an upper portion than said wiring trench.

* * * * *